US011837151B2

(12) United States Patent
Park et al.

(10) Patent No.: US 11,837,151 B2
(45) Date of Patent: Dec. 5, 2023

(54) DISPLAY MODULE AND DISPLAY APPARATUS HAVING THE SAME

(71) Applicant: SAMSUNG ELECTRONICS CO., LTD., Suwon-si (KR)

(72) Inventors: Sangyoung Park, Suwon-si (KR); Jongsu Oh, Suwon-si (KR); Hoseop Lee, Suwon-si (KR); Shigeta Tetsuya, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 10 days.

(21) Appl. No.: 17/523,436

(22) Filed: Nov. 10, 2021

(65) Prior Publication Data

US 2022/0172672 A1 Jun. 2, 2022

Related U.S. Application Data

(63) Continuation of application No. PCT/KR2021/013522, filed on Oct. 1, 2021.

(30) Foreign Application Priority Data

Nov. 30, 2020 (KR) .................. 10-2020-0164926

(51) Int. Cl.
*G09G 3/32* (2016.01)
*G09G 3/20* (2006.01)

(52) U.S. Cl.
CPC ............ *G09G 3/32* (2013.01); *G09G 3/2088* (2013.01); *G09G 3/2096* (2013.01);
(Continued)

(58) Field of Classification Search
CPC .. G09G 3/2007; G09G 3/2074; G09G 3/2096; G09G 3/32–3291;
(Continued)

(56) References Cited

U.S. PATENT DOCUMENTS 9,153,171 B2  10/2015  Sakariya et al.
9,406,714 B2   8/2016  Jung et al.
(Continued)

FOREIGN PATENT DOCUMENTS

KR  10-2015-0084362 A  7/2015
KR  10-2015-0085046 A  7/2015
(Continued)

OTHER PUBLICATIONS

Communication dated Aug. 17, 2022 by the European Patent Office in European Patent Application No. 21794083.2.
(Continued)

*Primary Examiner* — Nathan Danielsen
(74) *Attorney, Agent, or Firm* — Sughrue Mion, PLLC

(57) ABSTRACT

A display module includes a substrate; a plurality of pixels provided on a surface of the module substrate; a plurality of first micro-pixel controllers provided in spaces between the plurality of pixels, and a plurality of second micro-pixel controllers provided in a periphery area of the upper surface of the module substrate, wherein each of the plurality of first micro-pixel controllers controls two or more pixels of the plurality of pixels, and at least one function performed by the plurality of first micro-pixel controllers is different from at least one function performed by the plurality of second micro-pixel controllers.

16 Claims, 31 Drawing Sheets

(52) U.S. Cl.
CPC .......... *G09G 2300/026* (2013.01); *G09G 2300/0426* (2013.01); *G09G 2300/0452* (2013.01); *G09G 2300/0809* (2013.01)

(58) Field of Classification Search
CPC . G09G 2300/02; G09G 2300/04–0408; G09G 2300/0426; G09G 2300/0443; G09G 2300/0452; G09G 2300/0842; G09G 2300/0847; G09G 2300/0857; G09G 2300/0861; G09G 2310/0208; G09G 2310/0221; G09G 2310/0243; G09G 2310/0251; G09G 2310/0267; G09G 2310/027; G09G 2310/0278; G09G 2310/0286; G09G 2310/06; G09G 2310/08; G09G 2320/0233–0242; G09G 2320/0252; G09G 2320/066; G09G 2320/0666; G09G 2320/0686; G06F 3/14; G06F 3/1423–1446
See application file for complete search history.

(56) References Cited

U.S. PATENT DOCUMENTS

| | | | |
|---|---|---|---|
| 10,128,308 | B1 | 11/2018 | Shin et al. |
| 10,283,037 | B1 | 5/2019 | Far et al. |
| 10,650,737 | B2 | 5/2020 | Vahid Far et al. |
| 10,714,001 | B2 | 7/2020 | Cok et al. |
| 10,762,836 | B1 | 9/2020 | Bae et al. |
| 11,222,580 | B2 | 1/2022 | Lee et al. |
| 11,373,586 | B2 * | 6/2022 | Jeong ............... G09G 3/32 |
| 2009/0121988 | A1 * | 5/2009 | Amo ................. G09G 3/32 345/82 |
| 2010/0207852 | A1 * | 8/2010 | Cok .................. H01L 27/3213 345/83 |
| 2012/0006978 | A1 | 1/2012 | Ludwig |
| 2016/0099262 | A1 * | 4/2016 | Lin .................. H01L 27/1222 257/43 |
| 2016/0163264 | A1 * | 6/2016 | Nishimura ......... G09G 3/3266 345/212 |
| 2019/0148409 | A1 * | 5/2019 | Bang ................ H01L 23/367 345/173 |
| 2019/0206330 | A1 * | 7/2019 | Kim ................. G09G 3/3233 |
| 2019/0206333 | A1 * | 7/2019 | Kim ................. H10K 59/129 |
| 2019/0371232 | A1 * | 12/2019 | Kim ................. H01L 25/0753 |
| 2020/0020676 | A1 | 1/2020 | Cok et al. |
| 2020/0111403 | A1 * | 4/2020 | Kim ................. G09G 3/32 |
| 2022/0309997 | A1 * | 9/2022 | Hu .................. G09G 3/3426 |

FOREIGN PATENT DOCUMENTS

| | | |
|---|---|---|
| KR | 10-2018-0052977 A | 5/2018 |
| KR | 10-2018-0119273 A | 11/2018 |
| KR | 10-2019-0141974 A | 12/2019 |
| KR | 10-2153849 B1 | 9/2020 |

OTHER PUBLICATIONS

International Search Report dated Jan. 11, 2022 issued by the International Searching Authority in International Application No. PCT/KR2021/013522 (PCT/ISA/210).
Communication dated Dec. 22, 2022 issued by the European Patent Office in European Patent Application No. 21794083.2.

* cited by examiner

DISPLAY MODULE AND DISPLAY APPARATUS HAVING THE SAME

CROSS-REFERENCE TO RELATED APPLICATION(S)

This application is a continuation application of International Application No. PCT/KR2021/013522, filed on Oct. 1, 2021, which claims priority from Korean Patent Application No. 10-2020-0164926, filed on Nov. 30, 2020, in the Korean Intellectual Property Office, the disclosures of which are incorporated herein in their entireties by reference.

BACKGROUND

1. Field

The disclosure relates to a display module which implements an image using an inorganic light emitting device and a display apparatus including the display module.

2. Description of the Related Art

Display apparatuses may be classified into self-emissive displays in which each pixel emits light by itself and passive light emitting displays which require separate light sources.

A liquid crystal display (LCD), which is a typical passive light emitting display, requires a backlight unit which supplies light from behind a display panel, a liquid crystal layer which serves as a switch configured to allow the light to pass or to block the light, a color filter which changes the supplied light to light of a desired color, and the like. Therefore, there is a limitation in reducing structural complexity and implementing thin thickness in a display apparatus.

On the other hand, the self-emissive display, in which each pixel includes a light emitting device to emit light by itself, does not require components such as a backlight unit and a liquid crystal layer, and a color filter may also be omitted. Accordingly, the self-emissive display is structurally simple and thus has a high degree of design freedom. In addition, not only a thin thickness may be implemented, but also an excellent contrast ratio, brightness, and a viewing angle may be implemented.

Among the self-emissive displays, a micro-light emitting diode (LED) display is a flat panel display and includes a plurality of LEDs having a size of a micro unit. When compared to the LCD which requires the backlight, the micro-LED display may provide high contrast, fast response time, and high energy efficiency.

In addition, the micro-LED, which is an inorganic light emitting device, is brighter, has better luminous efficiency, and has a longer lifetime than an organic LED (OLED) which requires a separate encapsulation layer to protect an organic material.

SUMMARY

Provided are a display module and a display apparatus in which a thin film transistor circuit configured to drive an inorganic light emitting device is provided in a separate chip so that circuit testing and replacement and a manufacturing process of the display module or the display apparatus including the display module may be more easily performed.

According to an aspect of the disclosure, there is provided a display module including: a substrate; a plurality of pixels provided on a surface of the substrate, each pixel of the plurality of pixels including a plurality of inorganic light emitting diodes (LEDs); and a plurality of first micro-pixel controllers provided in spaces between the plurality of pixels and configured to control the plurality of inorganic LEDs of each pixel of the plurality of pixels, a plurality of second micro-pixel controllers disposed provided in a periphery area of the surface of the module substrate, wherein each first micro-pixel controller of the plurality of first micro-pixel controllers is configured to control the plurality of inorganic LEDs of at least two pixels among the plurality of pixels, and wherein at least one function performed by the plurality of first micro-pixel controllers is different from at least one function performed by the plurality of second micro-pixel controllers.

According to the display module described above, the periphery area may be positioned outside a pixel array area, the pixel array area being defined by outermost pixels among the plurality of pixels.

According to the display modules described above, the periphery area may include at least one of a left periphery area, a right periphery area, an upper periphery area, or a lower periphery area.

According to the display modules described above, the periphery area may be included in an active area or a bezel area.

According to the display modules described above, the plurality of second micro-pixel controllers may be arranged in at least one of the left periphery area or the right periphery area along a column direction.

According to the display modules described above, the plurality of second micro-pixel controllers may be arranged in at least one of the upper periphery area or the lower periphery area along a row direction.

According to the display modules described above, a first portion of the plurality of second micro-pixel controllers may be arranged in at least one of the left periphery area or the right periphery area along a column direction, and a second portion of the plurality of second micro-pixel controllers may be arranged in at least one of the upper periphery area or the lower periphery area along a row direction.

According to the display modules described above, at least one function performed by a second micro-pixel controller among the first portion of the plurality of second micro-pixel controllers may be different from at least one function performed by a second micro-pixel controller among the second portion of the plurality of second micro-pixel controllers.

According to the display modules described above, each of the plurality of first micro-pixel controllers may include two or more pixel circuits configured to drive the two or more pixels.

According to the display modules described above, the at least one function performed by the plurality of first micro-pixel controllers and the at least one function performed by the plurality of second micro-pixel controllers may include at least one of a pixel drive function, a gate signal generation function, a voltage conversion function, an analog-digital conversion function, a sweep waveform generation function, a voltage adjustment function, a multiplexing function, a demultiplexing function, a static electricity protection function, or a heat radiation detection function.

According to an aspect of the disclosure, there is provided a display apparatus including: a plurality of display modules; and a frame configured to support the plurality of display modules, wherein each of the plurality of display modules includes: a substrate; a plurality of pixels arranged on an upper surface of the substrate, each pixel of the plurality of pixels including a plurality of inorganic light emitting diodes (LEDs); a plurality of first micro-pixel controllers disposed in spaces between the plurality of pixels and configured to control the plurality of inorganic LEDs of each pixel of the plurality of pixels; and a plurality of second micro-pixel controllers disposed in a periphery area of the upper surface of the substrate, wherein each of the plurality of first micro-pixel controllers is configured to control the plurality of inorganic LEDs of two or more pixels among the plurality of pixels, and wherein at least one function performed by the plurality of first micro-pixel controllers is different from at least one function performed by the plurality of second micro-pixel controllers.

According to the display apparatus described above, the periphery area may include at least one of a left periphery area, a right periphery area, an upper periphery area, or a lower periphery area.

According to the display apparatuses described above, the plurality of second micro-pixel controllers may be arranged in at least one of the left periphery area or the right periphery area along a column direction.

According to the display apparatuses described above, the plurality of second micro-pixel controllers may be arranged in at least one of the upper periphery area or the lower periphery area along a row direction.

According to the display apparatuses described above, a first portion of the plurality of second micro-pixel controllers may be arranged in at least one of the left periphery area or the right periphery area along a column direction, and a second portion of the plurality of second micro-pixel controllers may be arranged in at least one of the upper periphery area or the lower periphery area along a row direction.

According to the display apparatuses described above, at least one function performed by a second micro-pixel controller among the first portion of the plurality of second micro-pixel controllers may be different from at least one function performed by a second micro-pixel controller among the second portion of the plurality of second micro-pixel controllers.

According to the display apparatuses described above, the at least one function performed by the plurality of first micro-pixel controllers and the at least one function performed by the plurality of second micro-pixel controllers may include at least one of a pixel drive function, a gate signal generation function, a voltage conversion function, an analog-digital conversion function, a sweep waveform generation function, a voltage adjustment function, a multiplexing function, a demultiplexing function, a static electricity protection function and a heat radiation detection function.

According to an aspect of the disclosure, there is provided a display apparatus including: a plurality of display modules; and a frame configured to support the plurality of display modules, wherein each of the plurality of display modules includes: a substrate; a plurality of pixels arranged on an upper surface of the substrate, each pixel of the plurality of pixels including a plurality of inorganic light emitting diodes (LEDs); a plurality of first micro-pixel controllers disposed in spaces between the plurality of pixels and configured to control the plurality of inorganic LEDs of each of the plurality of pixels; and a plurality of second micro-pixel controllers disposed in a periphery area on the upper surface of the substrate, a first portion of the plurality of second micro-pixel controllers being disposed in at least one of a left periphery area or a right periphery area and a second portion of the plurality of second micro-pixel controllers being disposed in at least one of an upper periphery area or a lower periphery area, wherein at least one function performed by the plurality of first micro-pixel controllers is different from at least one function performed by the plurality of second micro-pixel controllers, wherein a signal output from a second micro-pixel controller among the first portion of the plurality of second micro-pixel controllers is transmitted in a row direction through the plurality of first micro-pixel controllers, and wherein a signal output from a second micro-pixel controller among the second portion of the plurality of second micro-pixel controllers is transmitted in a column direction through the plurality of first micro-pixel controllers.

The periphery area may be positioned outside a pixel array area, the pixel array area being defined by outermost pixels among the plurality of pixels.

The periphery area may be included in an active area or a bezel area.

According to a display module and a display apparatus including the same according to one aspect of the disclosure, since a thin film transistor circuit configured to drive an inorganic light emitting device is provided in a separate chip, circuit testing and replacement and a manufacturing process of the display module or the display apparatus including the display module may be more easily performed.

DESCRIPTION OF DRAWINGS

The above and other aspects, features, and advantages of certain embodiments of the present disclosure will be more apparent from the following description taken in conjunction with the accompanying drawings, in which.

DETAILED DESCRIPTION

Figure 1:
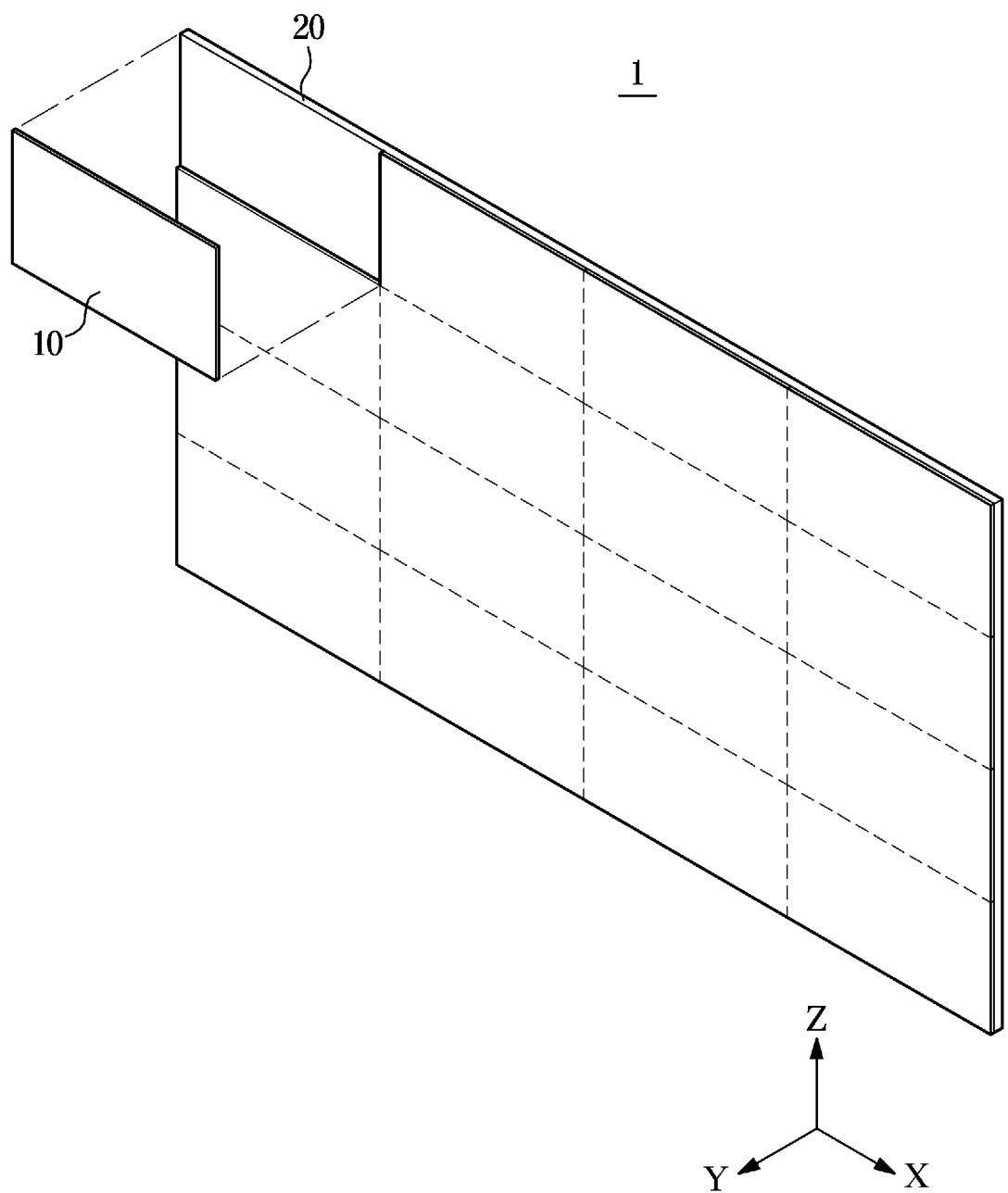
FIG. 1 is a perspective view illustrating an example of a display module and a display apparatus including the display module according to an embodiment.

Embodiments are described in detail with reference to the accompanying drawings. Like reference numerals denote like elements throughout the specification. In the specification, all elements of the embodiments are not described, and general contents in the art or repeated contents between the embodiments will not be described. Terms such as parts, modules, members, and blocks may be implemented using software or hardware, and a plurality of parts, modules, members, and blocks are implemented as a single element, or one part, module, member, or block may also include a plurality of elements.

Throughout the specification, when a part is referred to as being "connected" to another part, it includes "directly connected" to another part and "indirectly connected" to another part, and the "indirectly connected" to another part includes "connected" to another part through a wireless communication network, or electrically connected to another part through wiring, soldering, or the like.

In addition, when a part "includes" an element, another element may be further included, rather than excluding the existence of another element, unless otherwise described.

Throughout the specification, when a member is referred to as being "on" another member, the member is in contact with another member or yet another member is interposed between the two members.

Throughout the specification, when a member transmits or transfers a signal or data to another member, it does not preclude another member existing between the corresponding member and another member, and the signal or data is transmitted or transferred through another member unless otherwise described.

Through the specification, the expression of an ordinal number such as "first" and "second" is used to distinguish a plurality of members, and the used ordinal number does not indicate an arrangement order, a manufacturing order, importance, and the like of the members.

The singular expression includes a plural expression unless there are obvious exceptions in the context.

As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

In each step, an identification symbol is used to refer to each step, the identification symbol does not limit the order of each step, and each step may be performed in an order different from the described order unless the context clearly indicates a specific order.

Hereinafter, a display module and a display apparatus including the display module according to one aspect will be described with reference to the accompanying drawings.

Figure 2:
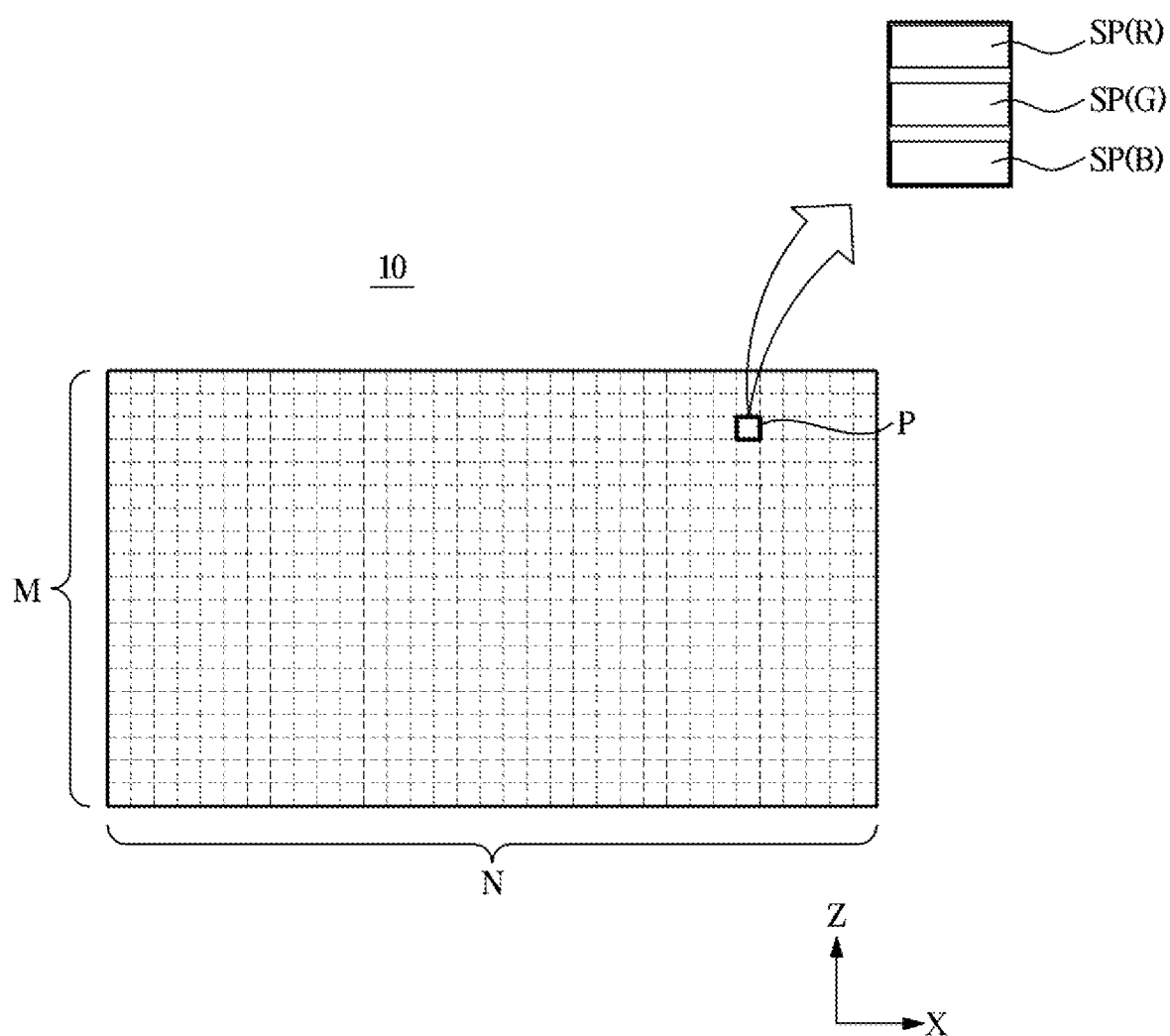
FIG. 2 is a view illustrating an example of a pixel array constituting a unit module of a display apparatus according to an embodiment.

FIG. 1 is a perspective view illustrating an example of a display module and a display apparatus including the display module according to an embodiment, and FIG. 2 is a view illustrating an example of a pixel array constituting a unit module of the display apparatus according to an embodiment.

The display apparatus according to an embodiment is a self-emissive display apparatus in which a light emitting device is disposed in each of pixels so that the pixel may emit light by itself. Accordingly, unlike a liquid crystal display apparatus, since the display apparatus according to an embodiment does not require components such as a backlight unit and a liquid crystal layer, a thin thickness may be implemented, a structure is simple, and thus a design may be variously changed.

In addition, in the display apparatus according to an embodiment, an inorganic light emitting device such as an inorganic light emitting diode may be used as the light emitting device disposed in each of the pixels. A response time of the inorganic light emitting device is faster than that of an organic light emitting device such as an organic light emitting diode (OLED), and the inorganic light emitting device may provide high brightness with low power.

In addition, unlike the organic light emitting device which requires an encapsulation process because it is vulnerable to exposure to moisture and oxygen and has low durability, the inorganic light emitting device does not require an encapsulation process and has high durability. Hereinafter, for illustrative purposes, the inorganic light emitting device will be described in the following embodiment by using an example of the inorganic light emitting diode.

The inorganic light emitting device used in the display apparatus according to an embodiment may be a micro-LED having a size in which a length of a short side is about 100 μm, about several tens of μm, or several μm. As described above, when the LED having a size of a micro unit is used, a pixel size may be reduced and a high-resolution may be implemented in the same size screen.

In addition, when an LED chip is manufactured in the size of a micro unit, a problem of being broken when bent due to properties of an inorganic material may be solved. That is, when the micro-LED chip is transferred onto a flexible substrate, the LED chip is not broken even when the substrate is bent, and thus a flexible display apparatus may also be implemented.

The display apparatus, in which the micro-LED is used, may be applied to various fields by using a very small pixel size and a thin thickness. As an example, as illustrated in FIG. 1, a plurality of display modules 10 onto which a plurality of micro-LEDs are transferred may be tiled to be fixed to a housing 20 so as to implement a large-area screen. A display apparatus 1 having such a large-area screen may be used as a signage, an electronic board, and the like, A three-dimensional coordinate system of XYZ-axes illustrated in FIG. 1 is based on the display apparatus 1, a plane on which a screen of the display apparatus 1 is positioned is an XZ-plane, and a direction in which an image is output or a direction in which an inorganic light emitting device emits light is a +Y direction. Since the coordinate system is based on the display apparatus 1, the same coordinate system may be applied regardless of whether the display apparatus 1 is in a lying position (e.g., lies on an XY-plane) or the display apparatus 1 is in a standing position (e.g., stands up in the XZ-plane).

The display apparatus 1 is generally used in a standing state, and a user watches an image from the front of the display apparatus 1. In this case, the +Y direction in which the image is output may be referred to as a forward direction, and the opposite direction may be referred to as a rearward direction.

In addition, the display apparatus 1 is generally manufactured in a lying state. Accordingly, a −Y direction of the display apparatus 1 may be referred to as a downward direction and the +Y direction may be referred to as an upward direction. That is, in an embodiment, which will be described below, the +Y direction may also be referred to as an upward direction or forward direction, and the −Y direction may also be referred to as a downward direction or rearward direction.

Except for an upper surface and a lower surface of the display apparatus 1 or the display module 10 having a flat plate shape, all of the remaining four surfaces may be referred to as side surfaces regardless of a posture of the display apparatus 1 or the display module 10.

In FIG. 1, a case in which the display apparatus 1 includes a plurality of display modules to implement a large-area screen is illustrated, but the embodiment of the display apparatus 1 is not limited thereto. The display apparatus 1 may include a single display module 10 and may be implemented as a television (TV), a wearable device, a portable device, a personal computer (PC) monitor, or the like.

Referring to FIG. 2, the display module 10 may include pixels of an M×N (M and N are integers greater than or equal to two) array, that is, a plurality of pixels which are two-dimensionally arranged. FIG. 2 is a view conceptually illustrating the pixel array, and a bezel area, a wiring area, or the like in which an image is not displayed may also be positioned in the display module 10 in addition to an active area in which the pixels are arranged.

In one or more embodiments, a case in which some components are two-dimensionally arranged may include not only a case in which some components are arranged on the same plane but also a case in which some components are arranged on different planes parallel to each other. In addition, the case in which the corresponding components are arranged on the same plane does not necessarily denote that upper ends of the arranged components should be positioned on the same plane and may include a case in which the upper ends of the arranged components are positioned on different planes parallel to each other.

A pixel P may include a plurality of subpixels which output light having different colors to provide various colors by mixing colors. For example, the pixel P may be formed with at least three subpixels which output light having different colors. Specifically, the pixel P may be formed with three subpixels SP(R), SP(G), and SP(B) respectively corresponding to red (R), green (G), and blue (B). In this case, a red subpixel SP(R) may output red light, a green subpixel SP(G) may output green light, and a blue subpixel SP(B) may output blue light.

However, the pixel array of FIG. 2 is only an example which may be applied to the display module 10 and the display apparatus 1 according to an embodiment. In other embodiments, for example, the subpixels may be arranged in an X-axis direction, may not be arranged in a line, and/or may be implemented to have sizes that are different from each other. The sizes or arrangement types of the subpixels are not limited as long as a single pixel includes the plurality of subpixels to generate various colors.

In addition, the pixel P does not necessarily include the red subpixel SP(R) which outputs the red light, the green subpixel SP(G) which outputs the green light, and the blue subpixel SP(B) which outputs the blue light. The pixel P may also include a subpixel which outputs yellow light or white light. That is, a color or type of light output from each subpixel and the number of subpixels are not limited and the principles explained herein can be applied to other subpixel arrangements beyond those specifically identified in the accompanying drawings.

However, in an embodiment which will be described below, the case in which the pixel P includes the red subpixel SP(R), the green subpixel SP(G), and the blue subpixel SP(B) will be described as an example for the sake of description.

As described above, each of the display module 10 and the display apparatus 1 according to an embodiment is a self-emissive display apparatus of which each of the pixels may emit light by itself. Accordingly, inorganic light emitting devices which emit light of different colors may be disposed in the subpixels. For example, a red inorganic light emitting device may be disposed in the red subpixel SP(R), a green inorganic light emitting device may be disposed in the green subpixel SP(G), and a blue inorganic light emitting device may be disposed in the blue subpixel SP(B).

Accordingly, in one or more embodiments, the pixel P may denote a cluster including a red inorganic light emitting device, a green inorganic light emitting device, and a blue inorganic light emitting device, and the subpixel may denote each of the inorganic light emitting devices.

Figure 3:
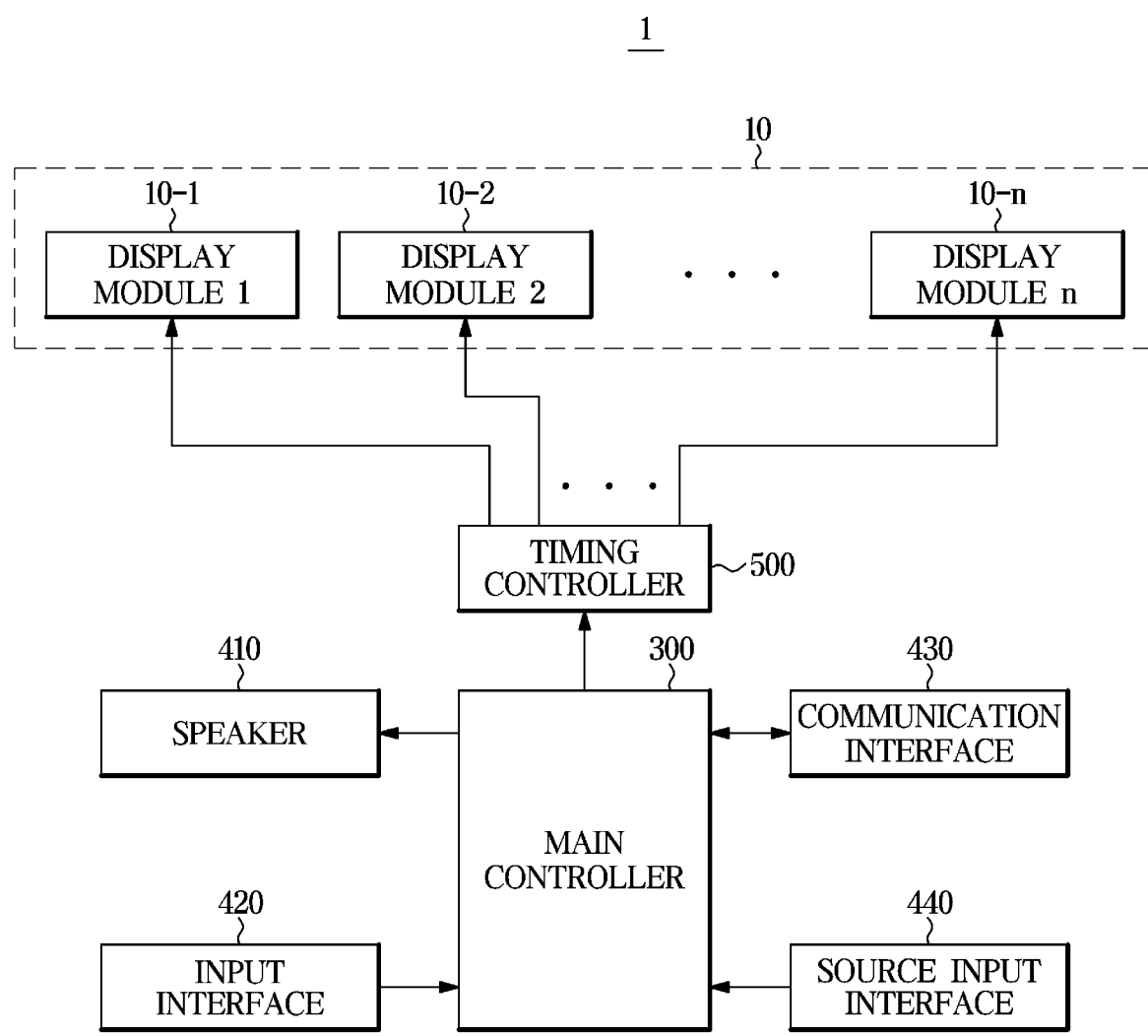
FIGS. 3 and 4 are control block diagrams of a display apparatus according to embodiments.
Figure 4:
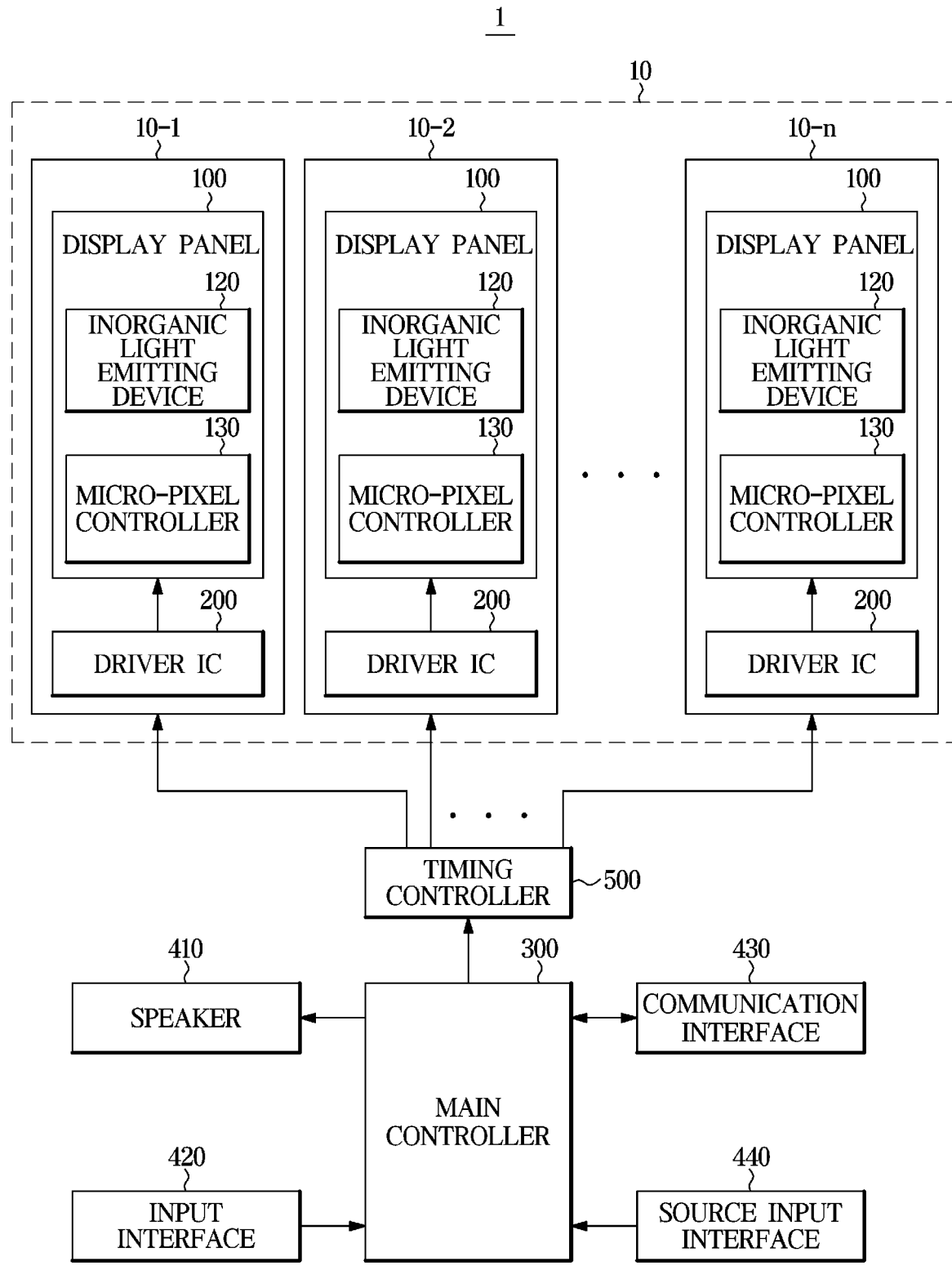

FIGS. 3 and 4 are control block diagrams of the display apparatus according to an embodiment.

Referring to FIG. 3, the display apparatus 1 according to an embodiment may include a plurality of display modules 10 including a display module 1 10-1, a display module 2 10-2, . . . a display module n 10-n (n is an integer greater than or equal to two), a main controller 300 and a timing controller 500 which control the plurality of display modules 10, a communication interface 430 which communicates with an external device, a source input interface 440 which receives a source image, a speaker 410 which outputs a sound, and an input interface 420 which receives a command for controlling the display apparatus 1 from a user.

The input interface 420 may also include a button or a touch pad provided in one area of the display apparatus 1, and in a case in which a display panel 100 (see FIG. 4) is implemented as a touch screen, the input interface 420 may include the touch pad provided on a front surface of a display panel 100. In addition, the input interface 420 may also include a remote controller. The display panel 100 may be a bezel type including a bezel area or of a bezel-less type that does not include a bezel area.

The input interface 420 may receive various commands for controlling the display apparatus 1 from a user to perform power on/off, volume adjustment, channel adjustment, screen adjustment, various setting changes, and the like of the display apparatus 1.

The speaker 410 may be provided in one area of a main body of the display apparatus 1, and a speaker module physically separated from the main body may be additionally or alternatively provided.

The communication interface 430 may communicate with a relay server or other electronic devices to transmit and receive relevant data. The communication interface 430 may use at least one of various wireless communication methods such as $3^{rd}$ Generation (3G), $4^{th}$ Generation (4G), wireless local area net (LAN), Wi-Fi, Bluetooth, Zigbee, Wi-Fi Direct (WFD), ultra-wideband (UWB), Infrared Data Association (IrDA), Bluetooth Low Energy (BLE), near field communication (NFC), and Z-Wave. In addition, the communication interface 430 may also use a wired communication method such as Peripheral Component Interconnect (PCI), PCI-express, or Universe Serial Bus (USB).

The source input interface 440 may receive a source signal input from a set-top box, a USB, an antenna, or the like. Accordingly, the source input interface 440 may include at least one selected from a source input interface group consisting of a High-Definition Multimedia Interface (HDMI) cable port, a USB port, an antenna, and the like.

The source signal received by the source input interface 440 may be processed by the main controller 300 and converted into the form capable of being output from the display panel 100 and the speaker 410.

The main controller 300 and the timing controller 500 may include at least one memory which stores a program for performing an operation, which will be described below, and various pieces of data and at least one processor configured to execute the stored program.

The main controller 300 may process a source signal input through the source input interface 440 to generate an image signal corresponding to the input source signal.

For example, the main controller 300 may include a source decoder, a scaler, an image enhancer, and a graphic processor. The source decoder may decode a source signal compressed in a format such as Moving Picture Experts Group (MPEG) and the like, and the scaler may output image data of a desired resolution through resolution conversion.

The image enhancer may improve image quality of image data by applying various compensation techniques. The graphic processor may divide pixels of image data into red-green-blue (RGB) data to output together with a control signal such as a syncing signal for a display timing at the display panel 100. That is, the main controller 300 may output image data and a control signal which corresponds to a source signal.

The above-described operation of the main controller 300 is only an example applicable to the display apparatus 1, other operations may be further performed, and some operations among the above-described operations may be omitted.

The image data and the control signal output from the main controller 300 may be transmitted to the timing controller 500.

The timing controller 500 may generate various control signals such as a timing control signal for converting the image data transmitted from the main controller 300 to image data having the form processable in a driver integrated circuit (IC) 200 (see FIG. 4) and displaying the image data on the display panel 100.

Although the display apparatus 1 according to an embodiment does not necessarily include the plurality of display modules 10, in the embodiment which will be described below, operations of the components will be specifically described using an example in which the display apparatus 1 includes the plurality of display modules 10 for description purposes.

Referring to FIG. 4, each of the plurality of display modules 10-1 and 10-2 to 10-$n$ may include the display panel 100 which displays an image and the driver IC 200 which drives the display panel 100.

The display panel 100 may include the plurality of pixels which are two-dimensionally arranged as described above, and each pixel may include the plurality of subpixels in order to implement various colors.

In addition, as described above, the display apparatus 1 according to an embodiment is a self-emissive display apparatus in which each pixel may emit light by itself. Accordingly, an inorganic light emitting device 120 may be disposed in each of the subpixels. That is, each of the plurality of pixels may be formed with two or more inorganic light emitting devices 120.

Although each of the inorganic light emitting devices 120 may be driven in an active matrix (AM) or passive matrix (PM) manner, in the embodiment which will be described below, the case in which the inorganic light emitting device 120 is driven in the AM manner will be described as an example for the sake of description.

In the display module 10 according to an embodiment, each of the inorganic light emitting devices 120 may be individually controlled by a micro-pixel controller 130, and the micro-pixel controller 130 may operate based on a drive signal output from the driver IC 200 or a timing control signal output from the timing controller 500.

Figure 5:
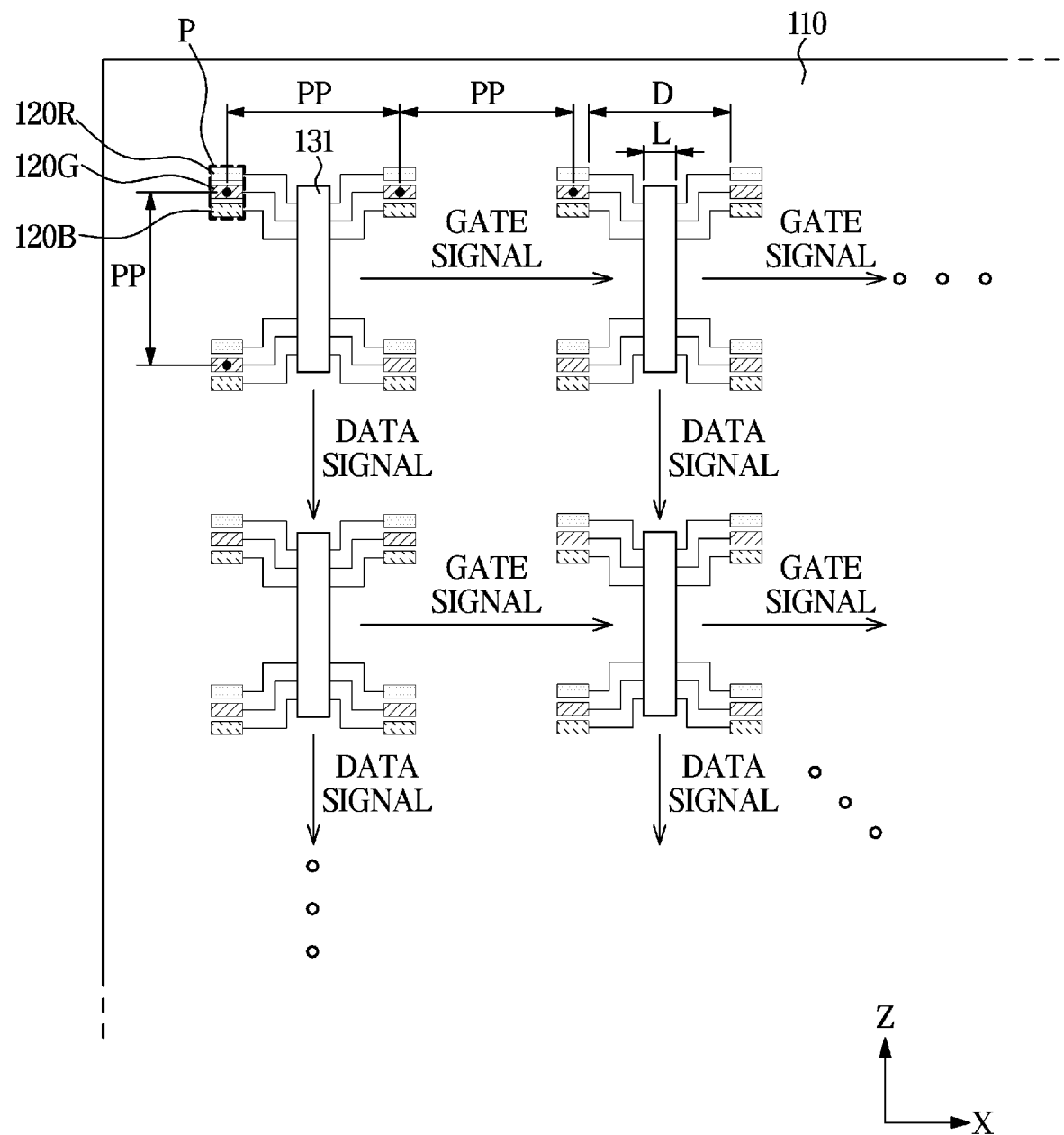
FIGS. 5 and 6 are views illustrating an arrangement of a first micro-pixel controller in a display module according to embodiments.
Figure 6:
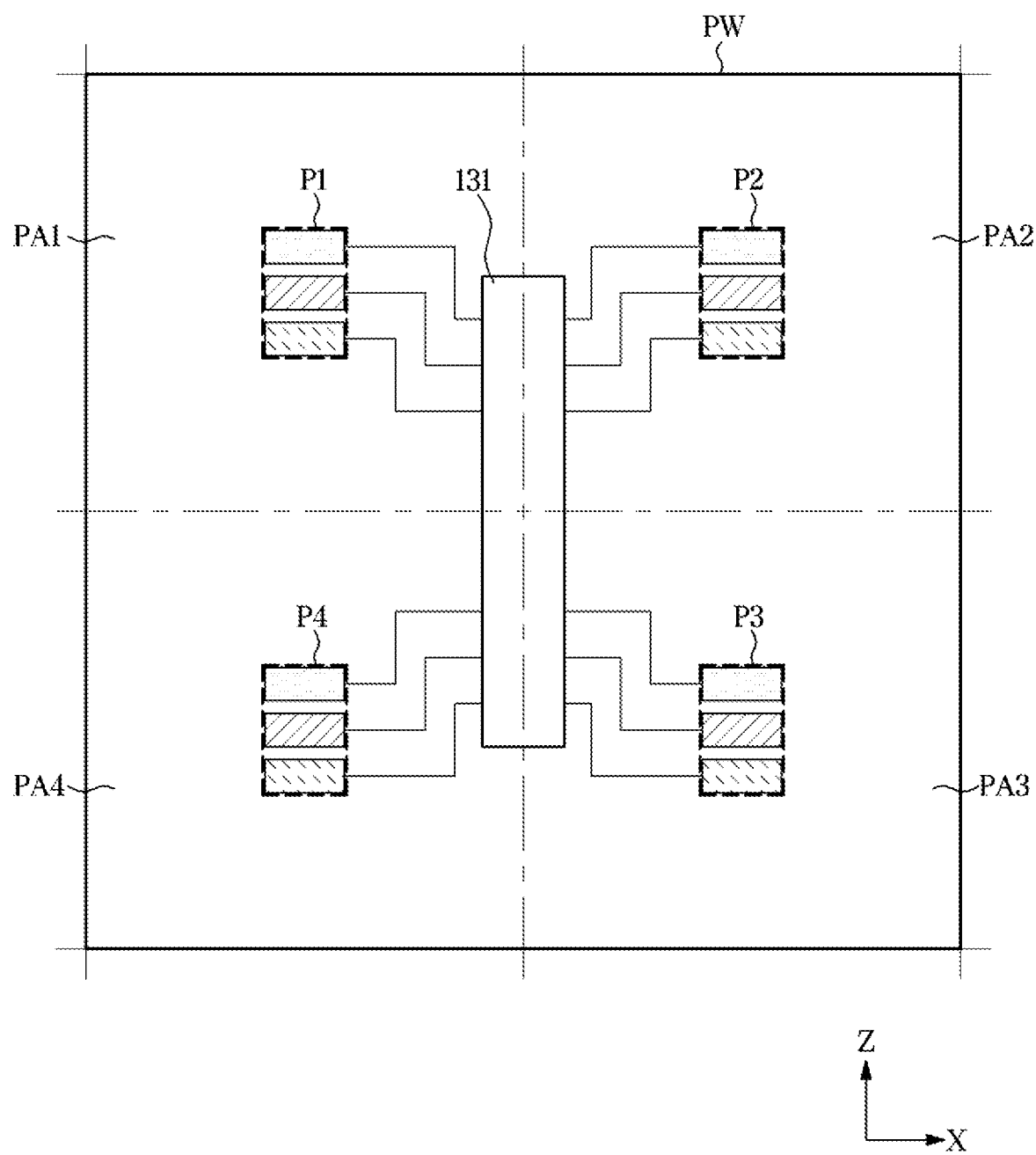

FIGS. 5 and 6 are views illustrating an arrangement of a first micro-pixel controller in the display module according to embodiments.

The micro-pixel controller 130 is classified in a plurality of types according to a function or arrangement thereof. The micro-pixel controller 130 includes a first micro-pixel controller 131 and a second micro-pixel controller 132 (refer to FIG. 8) which have different functions and arrangements.

The first micro-pixel controller 131 and the second micro-pixel controller 132 may perform various functions for controlling the plurality of pixels P. For example, each of the first micro-pixel controller 131 and the second micro-pixel controller 132 may perform at least one of a pixel drive function, a gate signal generation function, a voltage conversion (e.g., direct current (DC)-DC conversion) function, an analog-digital conversion function, a sweep waveform generation function, a voltage adjustment function, a multiplexing function, a demultiplexing function, a static electricity protection function, and a heat radiation detection function.

When the above-described functions are performed by an external circuit or external device, or another circuit layer is formed on a module substrate to perform the above-described functions, the wiring, the structure, and the manufacturing process of the display module become complex, a volume of a display module increases (becomes bulky), and a restriction on substrate selection increases.

However, when the above-described functions are performed by the micro-pixel controller 130 implemented as an ultra-small micro-IC as in the display module 10 according to an embodiment, the wiring, the structure, and the manufacturing process of the display module may be simplified, the volume of the display module decreases, and the freedom degree of substrate selection increases.

In an example embodiment in which the first micro-pixel controller 131 and the second micro-pixel controller 132 are provided, at least one function, among functions performed by the first micro-pixel controller 131, may be different from those among functions performed by the second micro-pixel controller 132. That is, the functions performed by the first micro-pixel controller 131 may be completely different from or partially overlap the functions performed by the second micro-pixel controller 132. For example, a pixel drive function is performed by the first micro-pixel controller 131 and not by the second micro-pixel controller 132. In another example, a voltage adjustment function may be performed by the first micro-pixel controller 131 and not by the second micro-pixel controller 132. In another example, the multiplexing function or the demultiplexing function may be performed by the second micro-pixel controller 132 and not by the first micro-pixel controller 131. However, these are merely examples and the embodiments are not limited thereto.

The first micro-pixel controller 131 and the second micro-pixel controller 132 may be disposed at appropriate positions according to functions to effectively control the plurality of pixels P. Hereinafter, example arrangements of the first micro-pixel controller 131 and the second micro-pixel controller 132 will be described.

Referring to FIG. 5, the plurality of pixels P may be two-dimensionally arranged on a surface (e.g., upper surface) of a module substrate 110, and the first micro-pixel controller 131 may be disposed in a space, in which the pixels P are not arranged, on the upper surface of the module substrate 110.

When the plurality of pixels P are disposed on the module substrate 110, a pixel spacing PP between adjacent pixels positioned on the top, bottom, left, and right sides may be the same. In embodiments, values that are described as the same may include not only a case in which the corresponding values are completely the same but also a case in which the corresponding values are within a predetermined error range each other.

The pixel spacing PP may be referred to as a pixel pitch, and in an embodiment, the pixel spacing PP is defined as a distance from a center of one pixel to a center of an adjacent pixel. However, the embodiment of the display module 10 is not limited thereto, and another definition about the pixel spacing PP may be applied.

One first micro-pixel controller 131 may control the plurality of pixels P, and the first micro-pixel controller 131 may be disposed in a space between the plurality of pixels P. In FIG. 5, although it is described that the first micro-pixel controller 131 controls four pixels P, the embodiment of the display module 10 is not limited thereto, and the number of pixels P controlled by the first micro-pixel controller 131 is not limited.

For example, the first micro-pixel controller 131 may have a rectangular hexahedron shape, and the first micro-pixel controller 131 may have an ultra-small size in which a length L of a short side of an upper surface or lower surface of the first micro-pixel controller 131 is smaller than a distance D between boundary lines of the pixels P adjacent to each other. The short side of the first micro-pixel controller 131 may be disposed parallel to a line indicating the shortest distance between two pixels P adjacent to each other. In this case, the distance D between the boundary lines of the pixels P adjacent to each other may denote a distance between the inorganic light emitting devices 120 included in the different pixels P among the inorganic light emitting devices 120 adjacent to each other.

That is, the first micro-pixel controller 131 may be disposed without affecting the spacing between the plurality of pixels P. Accordingly, even when the first micro-pixel controller 131 is disposed between the pixels P, the spacing between the pixels P may be minimized to implement a high-resolution in the same area.

Meanwhile, in a case in which one first micro-pixel controller 131 controls the pixels P in a m×2 (m is an integer greater than or equal to one) array, the first micro-pixel controller 131 may be disposed between two columns in which the pixels P (hereinafter, interchangeably used with the term "control target pixel") to be controlled are arranged as illustrated in FIG. 6.

Alternatively, in a case in which one first micro-pixel controller 131 controls the pixels P in a 2×n (n is an integer greater than or equal to one) array, the first micro-pixel controller 131 may be disposed between two rows in which the pixels P to be controlled are arranged.

FIG. 6 is an enlarged view illustrating the arrangement of the first micro-pixel controller which controls the pixels of a 2×2 array and the pixels to be controlled.

Referring to FIG. 6, the first micro-pixel controller 131 may be disposed in at least one among pixel areas PA1, PA2, PA3, and PA4 of four pixels P1, P2, P3, and P4 which are controlled by the first micro-pixel controller 131. In an embodiment, the pixel area is an area in which each pixel is positioned, and the pixel area may be defined as an area in which each pixel is included when active areas of the display panel 100 are divided into an array (M×N) which is the same as an array of the pixels.

Specifically, the first micro-pixel controller 131 may be disposed in one area or also disposed across two areas, three areas, or four areas as described in FIG. 6, among the pixel areas PA1, PA2, PA3, and PA4 of the pixels which are controlled by the first micro-pixel controller 131.

Alternatively, the first micro-pixel controller 131 may also be disposed at a center of one area in which the pixel areas PA1, PA2, PA3, and PA4 of the four pixels P1, P2, P3, and P4 controlled by the first micro-pixel controller 131 are included, that is, a total pixel area PW.

The first micro-pixel controller 131 may perform the pixel drive function. When the first micro-pixel controller 131 is disposed as described above, the first micro-pixel controller 131 may effectively supply a drive current to each of the plurality of pixels P controlled by the first micro-pixel controller 131. Specific components for performing the pixel drive function will be described below.

Meanwhile, the first micro-pixel controller 131 may be electrically connected to the control target pixels in order to control the pixels P. In an embodiment, a case in which two components are electrically connected may include not only a case in which two components are connected through a wire but also a case in which a conductive material, through which a current flows, is directly soldered or a conductive adhesive is used between the two components. The connection method is not specifically limited as long as a current flows between two connected components.

For example, in the case in which two components are soldered, Au—In bonding, Au—Sn bonding, Cu pillar/SnAg bump bonding, Ni pillar/SnAg bump bonding, SnAgCu, SnBi, SnAg solder ball bonding, or the like may be used.

In addition, in the case in which the conductive adhesive is used, the conductive adhesive such as an anisotropic conductive film (ACF) or anisotropic conductive paste (ACP) may be disposed between two components, and pressure may be applied thereto so that a current flows in a direction in which the pressure is applied.

FIGS. 7 to 13 are views illustrating an arrangement of the second micro-pixel controller in the display module according to an embodiment.

Figure 7:
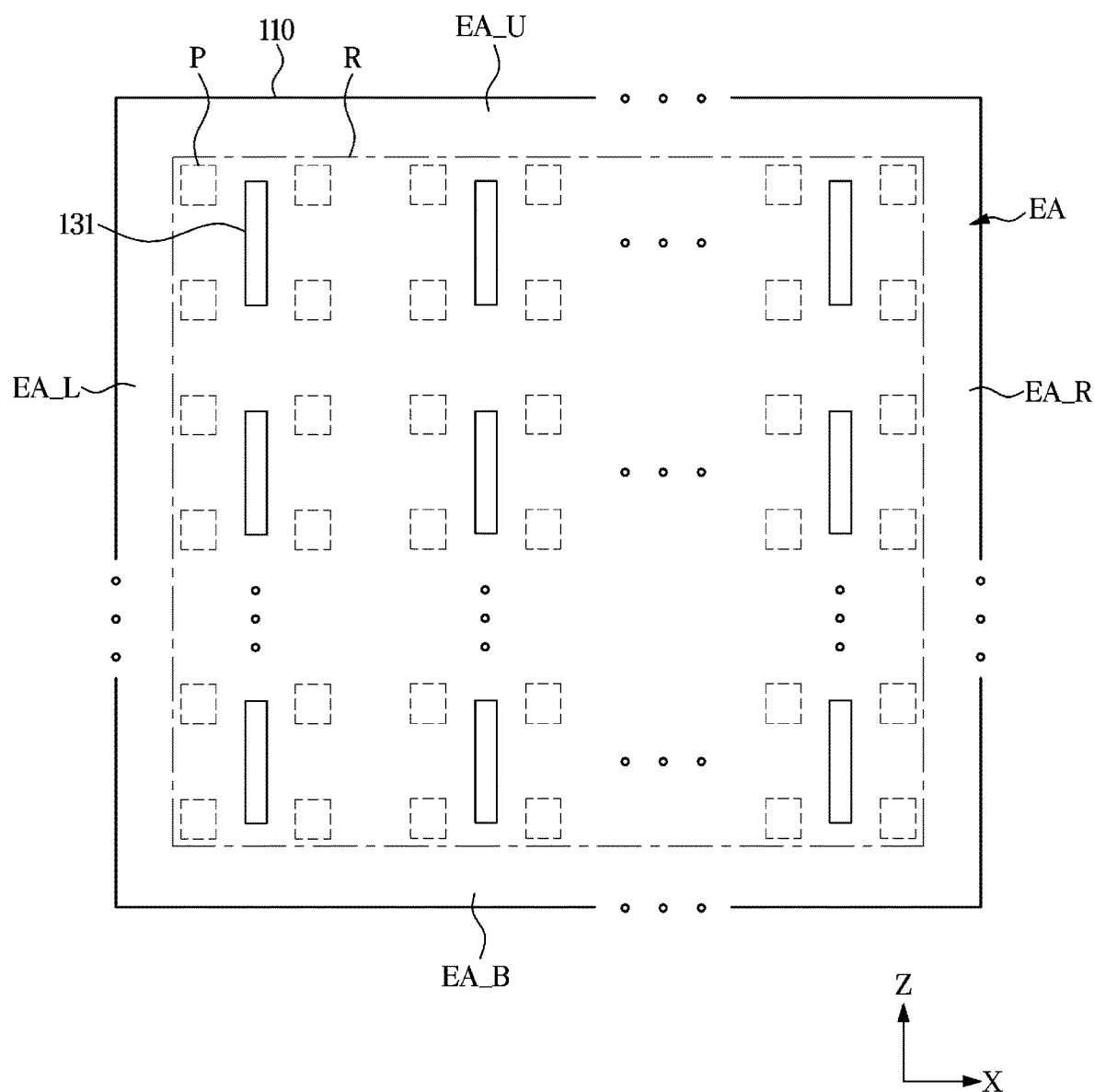
FIGS. 7 to 13 are views illustrating examples of an arrangement of a second micro-pixel controller in a display module according to embodiments.
Figure 8:
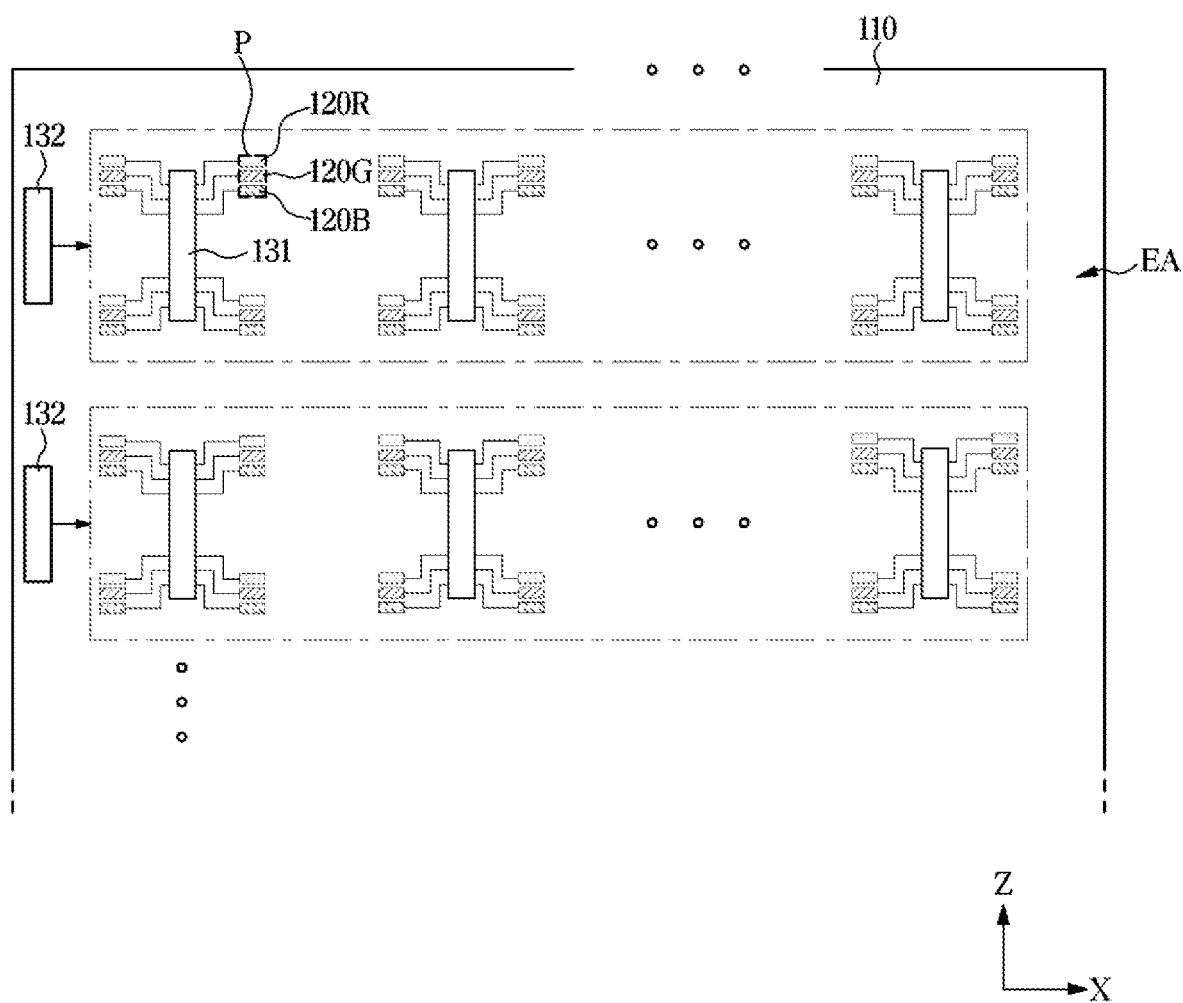

Referring to FIGS. 7 and 8, a plurality of second micro-pixel controllers 132 may be disposed in a periphery area EA on the upper surface of the module substrate 110. In an embodiment, the periphery area EA may denote an area positioned outside an area R defined by the pixels arranged at an outermost side among the plurality of pixels P arranged on the module substrate 110. In an embodiment which will be described below, the area R defined by the pixels disposed at the outermost side will be referred to as a pixel array area. In an embodiment, the pixel array area has a quadrilateral shape.

In addition, the periphery area EA may be included in the active area or may also be included in a bezel area in the display panel 100. For example, when the display panel is of a bezel type including a bezel area, the periphery area EA may be included in the bezel area, and when the display panel is of a bezel-less type that does not include a bezel area, the periphery area EA may be included in the active area.

The periphery area EA may include a left periphery area EA_L, a right periphery area EA_R, an upper periphery area EA_U, and a lower periphery area EA_B around the pixel array area R. In this case, left, right, upper, and lower periphery areas are based on a two-dimensional XZ-plane and may be different from the upward and downward directions on a three-dimensional space defined by the XYZ-axes defined above, which will be clearly understood by those skilled in the art.

As an example, the plurality of second micro-pixel controllers 132 may be disposed in at least one area of the left periphery area and the right periphery area. Referring to FIG. 8, the plurality of second micro-pixel controllers 132 may be arranged in the left periphery area EA_L in a column direction, that is, a Z-axis direction.

The second micro-pixel controller 132 may control the plurality of pixels P. As an example, the second micro-pixel controller 132 may control the plurality of pixels P in units of rows. That is, one second micro-pixel controller 132 may control the plurality of pixels P arranged in at least one row.

As a specific example, in a case in which one first micro-pixel controller 131 controls the plurality of pixels P of an m×n array (m and n are positive integers, at least one of m and n is greater than or equal to two), the second micro-pixel controller 132 disposed in the left periphery area EA_L may control the plurality of pixels P arranged in the m rows.

In FIG. 8, since one first micro-pixel controller 131 controls the pixels of a 2×2 array, the second micro-pixel controller 132 may control the plurality of pixels P arranged in two rows.

A signal generated by the second micro-pixel controller 132 to control the plurality of pixels P may be input to the first micro-pixel controller 131 corresponding to the second micro-pixel controller 132 and may also be input to each of the plurality of pixels P. To this end, the second micro-pixel controller 132 and the first micro-pixel controller 131 corresponding thereto or the plurality of pixels P which are control targets may be electrically connected.

In the present embodiment, the first micro-pixel controller 131 corresponding to the second micro-pixel controller 132 may denote the first micro-pixel controller 131 which shares the control target pixels with the second micro-pixel controller 132.

The signal generated by the second micro-pixel controller 132 may be input to a plurality of first micro-pixel controllers 131, and may also be input to each of the plurality of pixels through each of the plurality of first micro-pixel controllers 131. In a case in which the signal is transmitted through the plurality of first micro-pixel controllers 131, complexity of wiring may be reduced.

In the embodiment which will be described below, in order to distinguish signals output from the micro-pixel controllers 131 and 132, a signal output from the first micro-pixel controller 131 will be referred to as a first output signal, and a signal output from the second micro-pixel controller 132 will be referred to as a second output signal.

In a case in which the second output signal is transmitted through the first micro-pixel controllers 131, the second output signal may be input to the first micro-pixel controller 131 which controls the most adjacent pixel among the plurality of pixels P controlled by the second micro-pixel controller 132.

The second output signal may be transmitted in one direction. For example, the second output signal may be transmitted in a row direction (X-axis direction) and may be transmitted in a +X direction (right direction) or −X direction (left direction) according to a position of the second micro-pixel controller 132.

The first micro-pixel controller 131 which receives the second output signal may transmit the second output signal to the next first micro-pixel controller 131 adjacent in the row direction. In this case, the second output signal transmitted to the next first micro-pixel controller 131 may be a signal processed by the first micro-pixel controller 131.

In order to transmit the signal between the first micro-pixel controllers 131, the plurality of first micro-pixel controllers 131 may be electrically connected to the left and right adjacent first micro-pixel controllers 131.

As another example, in a case in which the first micro-pixel controller 131 controls the plurality of pixels P of an m×n array (m and n are positive integers, and at least one of m and n is greater than or equal to two), the second micro-pixel controller 132 may also control the plurality of pixels P arranged in 2 m rows.

Figure 9:
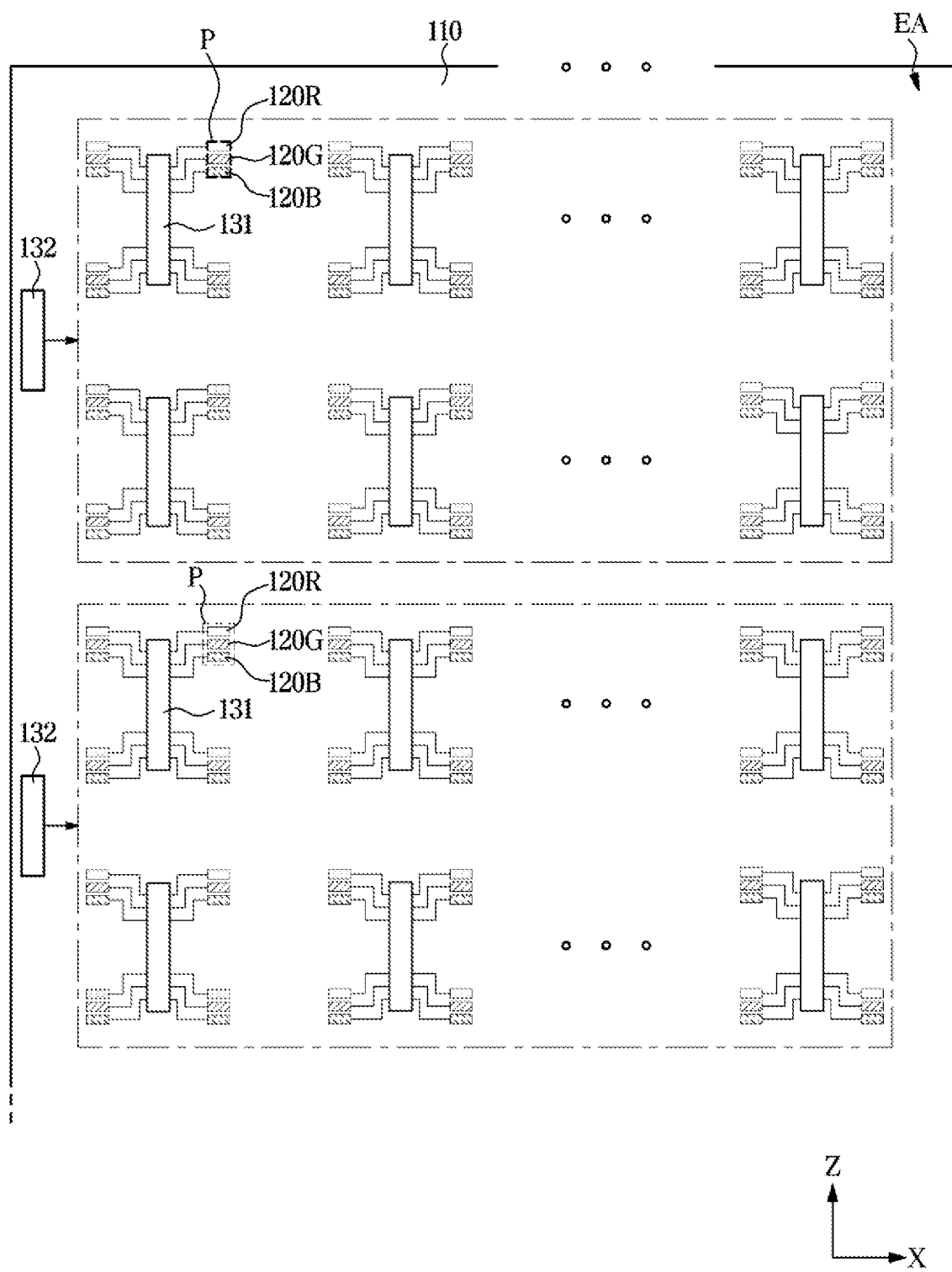

Referring to an example of FIG. 9, one second micro-pixel controller 132 may control the plurality of pixels P arranged in four rows. A signal output from the second micro-pixel controller 132 may be input to each of the plurality of first micro-pixel controllers 131 and may also be sequentially transmitted through the first micro-pixel controller 131. In the case in which the signal is transmitted through the first micro-pixel controller 131, efficient wiring becomes possible.

In the case in which the second output signal is transmitted through the first micro-pixel controllers 131, the second output signal output from one second micro-pixel controller 132 may be input to two first micro-pixel controllers 131 which control the pixels most adjacent to the second micro-pixel controller 132.

Figure 10:
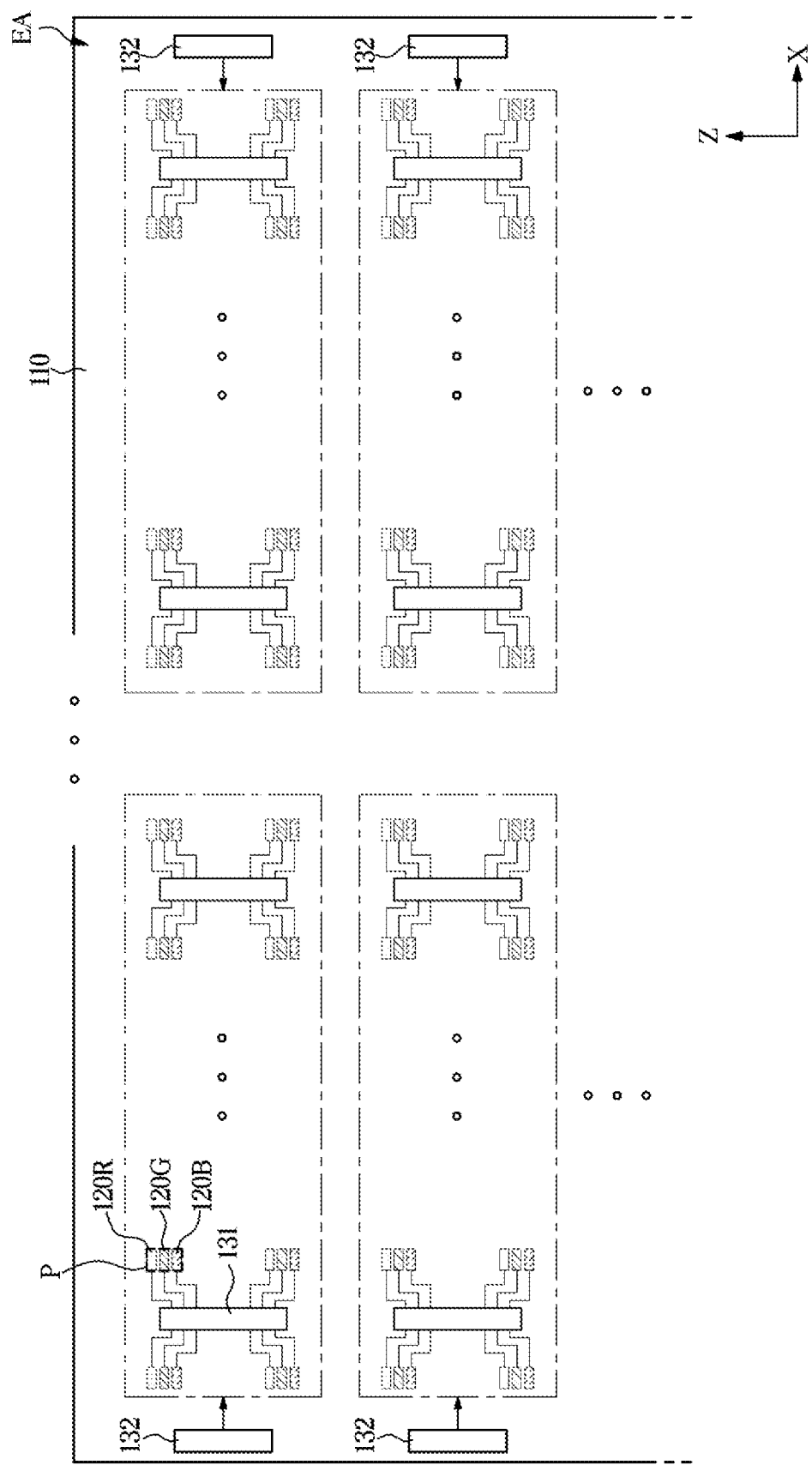

As illustrated in FIG. 10, the second micro-pixel controllers 132 may be disposed in both of the left periphery area EA_L and the right periphery area EA_R. In this case, one second micro-pixel controller 132 may control only some pixels among the pixels arranged in the row controlled by the one second micro-pixel controller 132.

For example, in a case in which N pixels are arranged in one row, the second micro-pixel controller 132 disposed in the left periphery area EA_L may control N−y (N and y are integers greater than or equal to one, and N>y) pixels from the left, and the second micro-pixel controller 132 disposed in the right periphery area EA_R may control y pixels from the right. As described above, when the second micro-pixel controllers 132 are disposed in both of the left periphery area EA_L and the right periphery area EA_R and the second micro-pixel controllers 132 disposed at both sides share control of the pixels, the length or complexity of wiring may be reduced, noise or distortion due to transmission of the signal may be reduced, and a load applied to the second micro-pixel controller 132 may be reduced.

Figure 11:
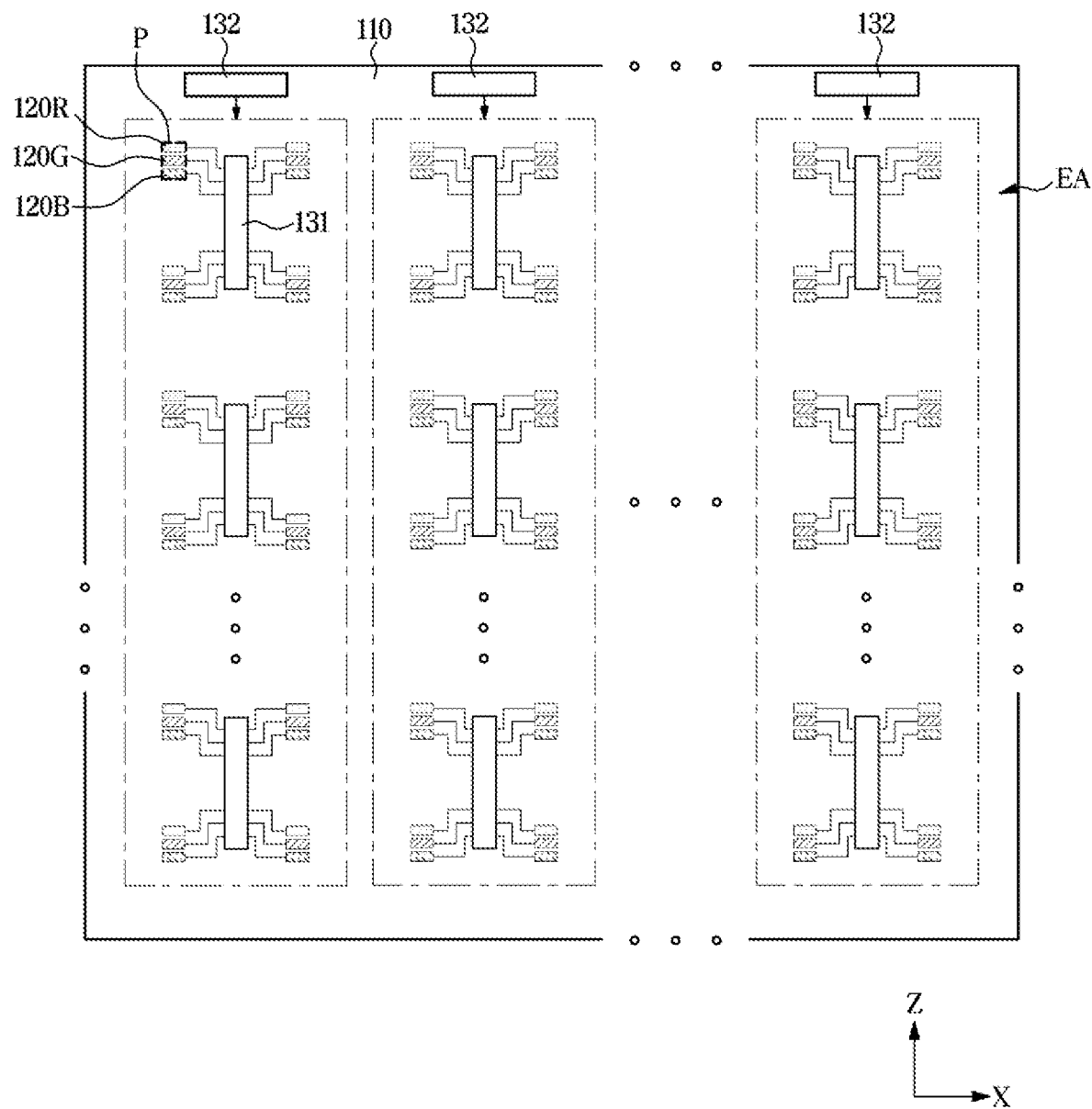
Figure 12:
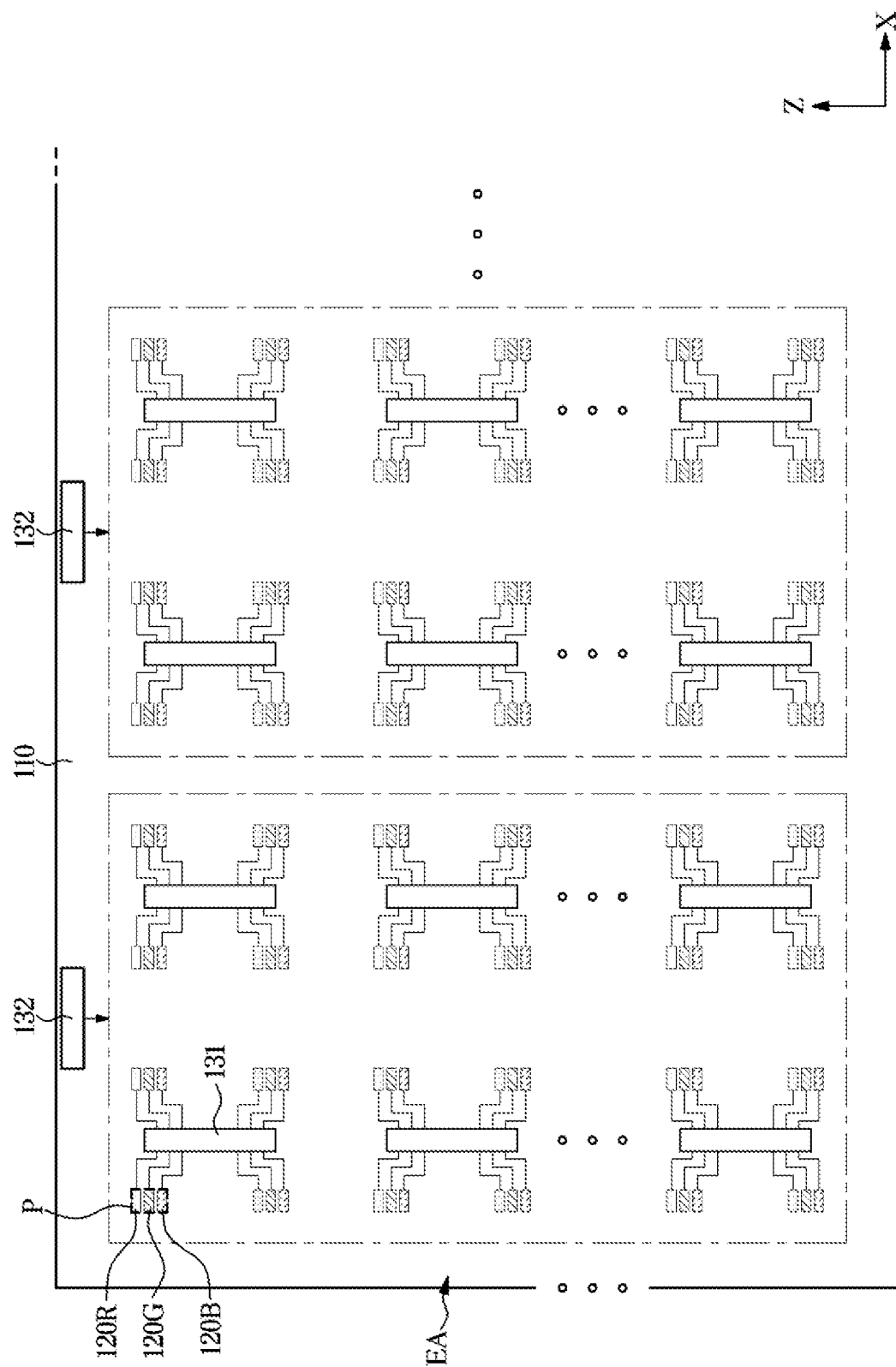
Figure 13:
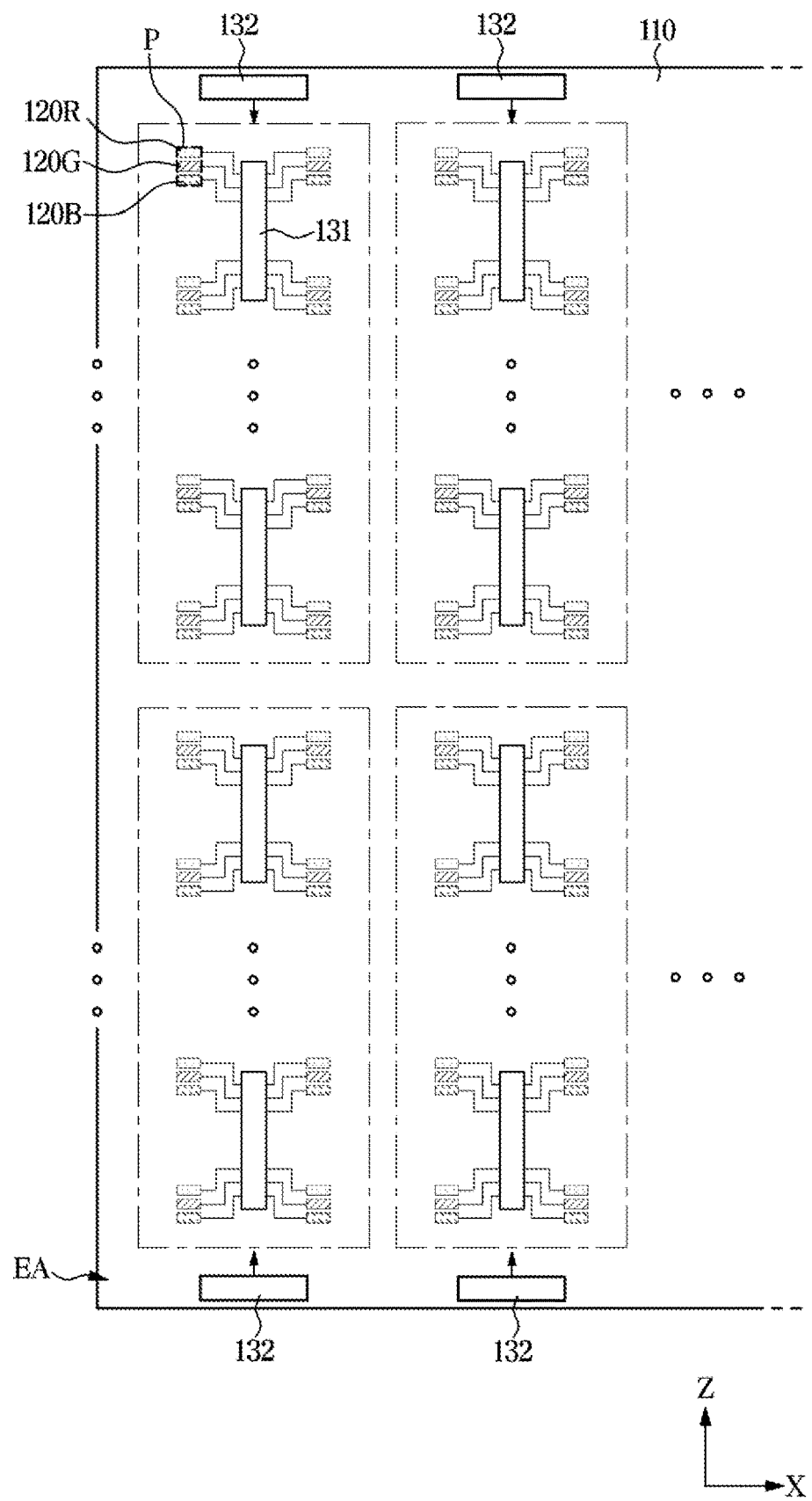

FIGS. 11 to 13 are views illustrating other examples of arrangements of the second micro-pixel controller 132 in the display module according to an embodiment.

As another example, the second micro-pixel controller 132 may be disposed in at least one area of the upper periphery area EA_U and the lower periphery area EA_B. In FIGS. 11 and 12, a case in which the second micro-pixel controller 132 is disposed in the upper periphery area EA_U is illustrated.

In the case in which the second micro-pixel controller 132 is disposed in the upper periphery area EA_U, the second micro-pixel controller 132 may control the plurality of pixels P in units of columns. That is, one second micro-pixel controller 132 may control the plurality of pixels P arranged in at least one column.

For example, one first micro-pixel controller 131 controls the plurality of pixels P of an m×n array (m and n are positive integers, and at least one of m and n is greater than or equal to two), the second micro-pixel controller 132 disposed in the upper periphery area EA_U may control the plurality of pixels P arranged in n columns.

According to an example of FIG. 11, in a case in which one first micro-pixel controller 131 controls the pixels of a 2×2 array, one second micro-pixel controller 132 may control the plurality of pixels P disposed in two columns. To this end, a signal output from the second micro-pixel controller 132 may be input to each of the plurality of pixels P, may also be input to each of the plurality of first micro-pixel controllers 131 and sequentially transmitted through the first micro-pixel controllers 131. Accordingly, the second micro-pixel controller 132 may be electrically connected to the first micro-pixel controllers 131 or the plurality of pixels P.

In the case in which the second output signal output from the second micro-pixel controller 132 is transmitted through the first micro-pixel controllers 131, the second output signal may be input to the first micro-pixel controller 131 which controls the most adjacent pixel among the plurality of pixels P controlled by the second micro-pixel controller 132.

The first micro-pixel controller 131 which receives the second output signal may transmit the second output signal to the next first micro-pixel controller 131 adjacent in the column direction. In this case, the second output signal transmitted to the next first micro-pixel controller 131 may be a signal processed by the first micro-pixel controller 131.

In order to transmit the signal between the first micro-pixel controllers 131, the plurality of first micro-pixel controllers 131 may be electrically connected to the vertically adjacent first micro-pixel controllers 131.

As another example, in a case in which the first micro-pixel controller 131 controls the plurality of pixels P of an m×n array (m and n are positive integers, and at least one of m and n is greater than or equal to two), the second micro-pixel controller 132 may control the plurality of pixels P arranged in 2n columns.

Referring to an example of FIG. 12, one second micro-pixel controller 132 may control the plurality of pixels P arranged in four columns. The signal output from the second micro-pixel controller 132 may be input to each of the plurality of pixels P and may also be sequentially transmitted through the first micro-pixel controller 131. In the case in which the signal is transmitted through the first micro-pixel controller 131, efficient wiring becomes possible.

In the case in which the second output signal is transmitted through the first micro-pixel controller 131, the second output signal output from one second micro-pixel controller 132 may be input to two first micro-pixel controllers 131 which control pixels most adjacent to the second micro-pixel controller 132.

As illustrated in FIG. 13, the second micro-pixel controllers 132 may also be disposed in both of the upper periphery area EA_U and the lower periphery area EA_B. In this case, one second micro-pixel controller 132 may control only some of the pixels disposed in a column controlled by the one second micro-pixel controller 132.

For example, in a case in which M pixels are arranged in one column, the second micro-pixel controller 132 disposed in the upper periphery area EA_U may control M−x (M and x are integers greater than or equal to one, and M>x) pixels from the upper side, and the second micro-pixel controller 132 disposed in the lower periphery area EA_B may control x pixels from the lower side. As described above, when the second micro-pixel controllers 132 are disposed in both of the upper periphery area EA_U and the lower periphery area EA_B and the second micro-pixel controllers 132 disposed at the both sides share control of the pixels, the length or complexity of wiring may be reduced, noise or distortion due to transmission of a signal may be reduced, and a load applied to the second micro-pixel controller 132 may be reduced.

Figure 14:
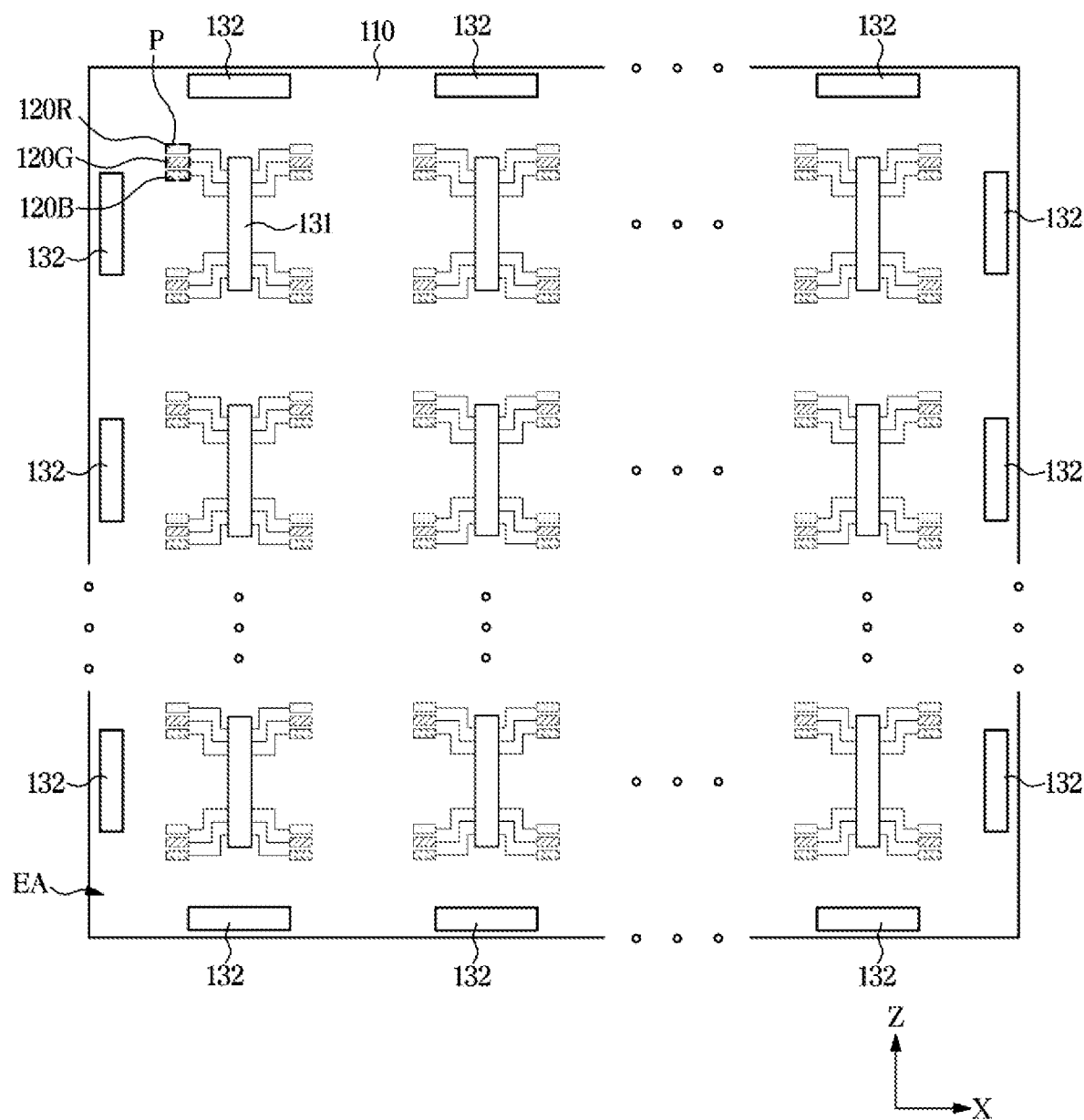
FIG. 14 is a view illustrating an arrangement of a first micro-pixel controller and an arrangement of a second micro-pixel controller in a display module according to an embodiment.

FIG. 14 is a view illustrating an arrangement of the first micro-pixel controller and an arrangement the second micro-pixel controller in the display module according to an embodiment.

Referring to FIG. 14, the second micro pixel-controllers 132 may be disposed in all of the left periphery area EA_L, the right periphery area EA_R, the upper periphery area EA_U and the lower periphery area EA_B.

First, as described above, at least one of the functions performed by the first micro-pixel controller 131 may be different from those of the functions performed by the second micro-pixel controller 132. The functions performed by the first micro-pixel controller 131 may be completely different from or may partially overlap the functions performed by the second micro-pixel controller 132. In addition, since even the same type of micro-pixel controllers may have different functions according to positions thereof, at least one of the functions performed by the second micro-pixel controller 132 disposed in the left periphery area EA_L or the right periphery area EA_R may be different from those of the functions performed by the second micro-pixel controller 132 disposed in the upper periphery area EA_U or the lower periphery area EA_B.

For example, the first micro-pixel controllers 131 disposed in the spaces between the plurality of pixels P may perform the pixel drive function, the second micro-pixel controllers 132 arranged in the left periphery area EA_L or the right periphery area EA_R in the column direction may perform the gate signal generation function or the sweep waveform generation function, and the second micro-pixel controllers 132 disposed in the upper periphery area EA_U or the lower periphery area EA_B in the row direction may perform the demultiplexing function or the voltage conversion function.

However, the above-described functions for each micro-pixel controller is only an example applicable to the embodiment of the display module 10, and various functions may be assigned to the micro-pixel controllers in various combinations in addition thereto.

Hereinafter, examples of functions which may be performed by the micro-pixel controllers will be described.

Figure 15:
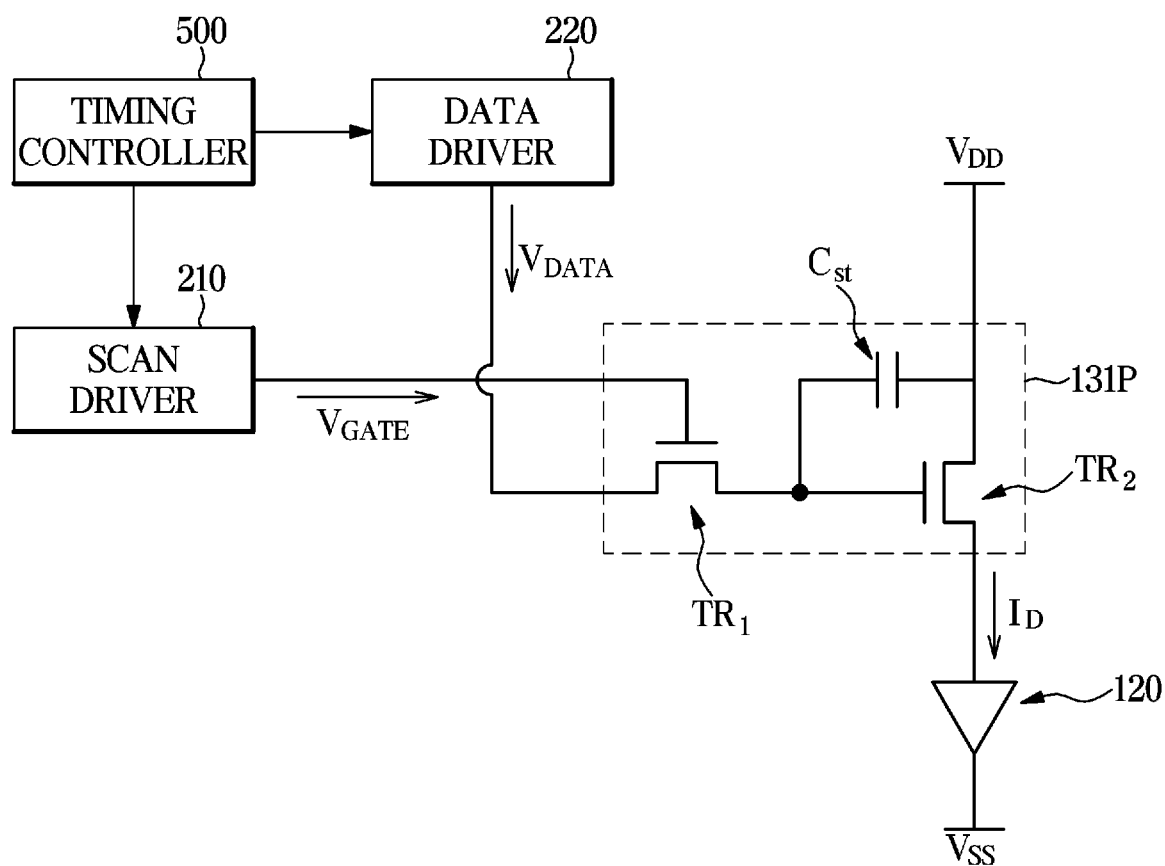
FIG. 15 is a view schematically illustrating a basic circuit structure for performing a pixel drive function in a display module according to an embodiment.

FIG. 15 is a view schematically illustrating a basic circuit structure for performing the pixel drive function in the display module according to an embodiment.

Referring to FIG. 15, the driver IC 200 may include a scan driver 210 and a data driver 220. The scan driver 210 may output a gate signal for turning the subpixel on/off, and the data driver 220 may output a data signal for realizing an image.

The driver IC 200 may be electrically connected to the display panel 100 using one of various methods such as a chip on film (COF) or film on glass (FOG) bonding method, a chip on glass (COG) bonding method, and a tape automated bonding (TAB) bonding method.

As an example, in a case in which the COF bonding method is used, the driver IC 200 is mounted on a film, one end of the film on which the driver IC 200 is mounted may be electrically connected to the module substrate 110, and the other end may be electrically connected to a flexible printed circuit board (FPCB).

However, according to various design changes, some operations of the driver IC 200 may be performed by the micro-pixel controller 130. For example, since an operation of the scan driver 210 may also be performed by the micro-pixel controller 130, in this case, the driver IC 200 may not include the scan driver 210. This case will be described below.

The scan driver 210 may generate a gate signal based on a timing control signal transmitted from the timing controller 500, and the data driver 220 may generate a data signal based on image data transmitted from the timing controller 500. The gate signal may include a gate voltage for turning the subpixel on, and the data signal may include a data voltage for indicating a gradient of an image.

The first micro-pixel controller 131 may include a pixel circuit 131P for individually controlling each of the inorganic light emitting devices 120, and the gate signal output from the scan driver 210 and the data signal output from the data driver 220 may be input to the pixel circuit 131P. Although the gate signal is illustrated as being input from the scan driver 210 in FIG. 15, the gate signal may also be generated in the first micro-pixel controller 131 or the second micro-pixel controller 132 as described later.

For example, when a gate voltage $V_{GATE}$, a data voltage $V_{DATA}$, and a power voltage $V_{DD}$ are input to the pixel circuit 131P, the pixel circuit 131P may output a drive current $I_D$ for driving the inorganic light emitting device 120.

The drive current $I_D$ output from the pixel circuit 131P may be input to the inorganic light emitting device 120, and the inorganic light emitting device 120 may emit light and provide an image using the input drive current $I_D$.

Specifically, the pixel circuit 131P may include thin film transistors $TR_1$ and $TR_2$ which switch or drive the inorganic light emitting device 120 and a capacitor $C_{st}$. As described above, the inorganic light emitting device 120 may be a micro-light emitting diode (LED).

As an example, the thin film transistors $TR_1$ and $TR_2$ may include a switching transistor $TR_1$ and a drive transistor $TR_2$, and the switching transistor $TR_1$ and the drive transistor $TR_2$ may be implemented as p-channel metal oxide semiconductor (PMOS) type transistors. However, the embodiment of the display module 10 and the display apparatus 1 is not limited thereto, and the switching transistor $TR_1$ and the drive transistor $TR_2$ may also be implemented as n-channel MOS type transistors.

In the switching transistor $TR_1$, the gate voltage $V_{Gate}$ is input to a gate electrode, the date voltage $V_{Data}$ is input to a source electrode, and a drain electrode is connected to one end of the capacitor $C_{st}$ and a gate electrode of the drive transistor $TR_2$.

In addition, in the drive transistor $TR_2$, the power voltage $V_{DD}$ is applied to a source electrode, and a drain electrode is connected to an anode of the inorganic light emitting device 120. A reference voltage $V_{SS}$ may be applied to a cathode of the inorganic light emitting device 120. The reference voltage $V_{SS}$ is a voltage having a lower level than the power voltage $V_{DD}$, and a ground voltage or the like may be used as the reference voltage $V_{SS}$ so that grounding may be provided.

The pixel circuit 131P having the above-described structure may operate as follows. First, when the gate voltage $V_{GATE}$ is applied and the switching transistor $TR_1$ is turned on, the data voltage $V_{DATA}$ may be transmitted to one end of the capacitor $C_{st}$ and the gate electrode of the drive transistor $TR_2$.

Due to the capacitor $C_{st}$, a voltage corresponding to a gate-source voltage $V_{GS}$ of the drive transistor $TR_2$ may be maintained for a predetermined time. The drive transistor $TR_2$ applies the drive current $I_D$ corresponding to the gate-source voltage $V_{GS}$ to the anode of the inorganic light emitting device 120 so that the inorganic light emitting device 120 may emit light.

Figure 16:
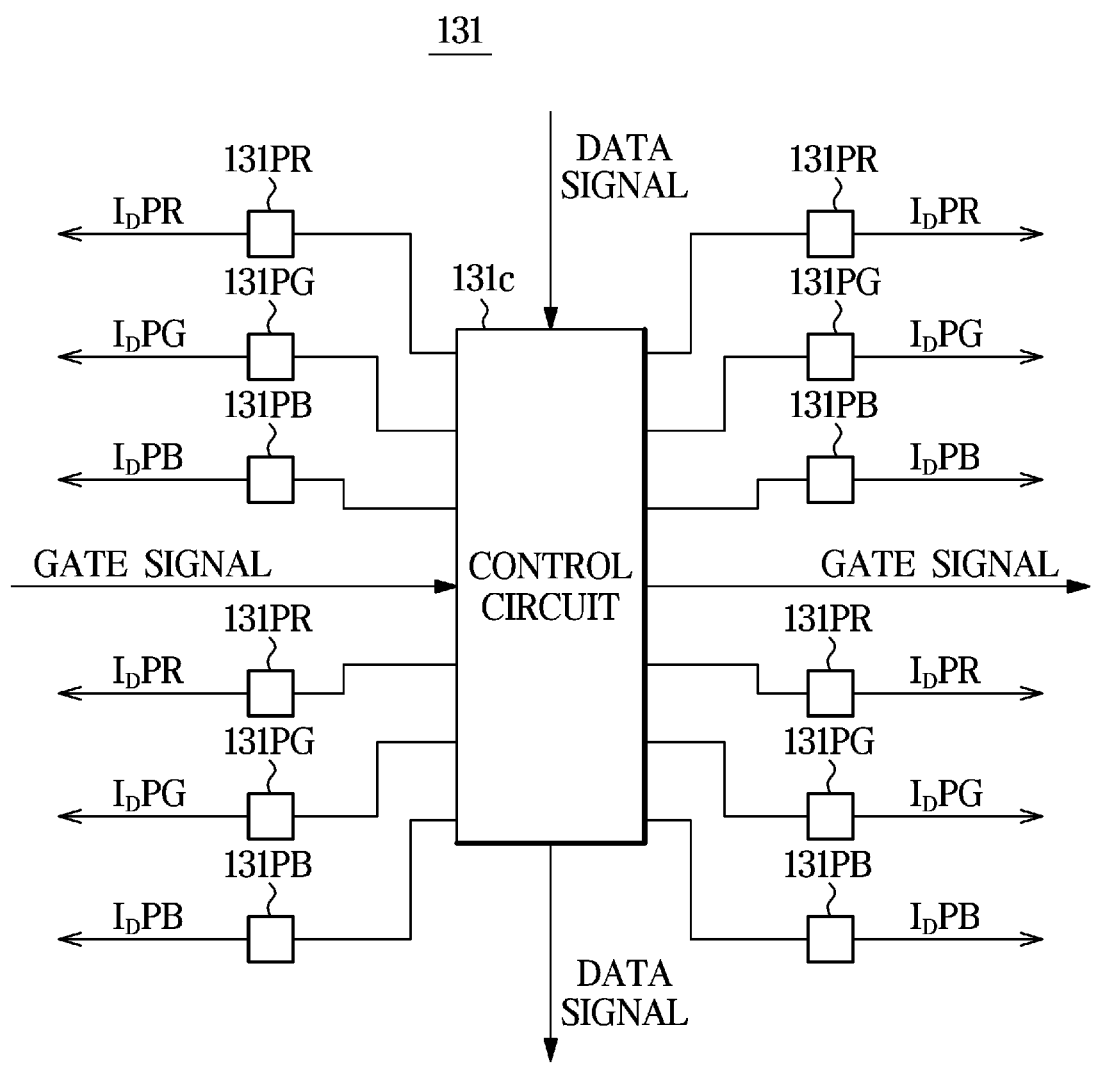
FIG. 16 is a view schematically illustrating an internal structure of a first micro-pixel controller which performs a pixel drive function in a display module according to an embodiment.

FIG. 16 is a view schematically illustrating an internal structure of the first micro-pixel controller which performs the pixel drive function in the display module according to an embodiment.

Referring to FIG. 16, the first micro-pixel controller 131 may include the pixel circuit 131P described above, and the pixel circuit 131P may be provided to correspond to the number of the inorganic light emitting devices 120 controlled by the first micro-pixel controller 131.

For example, in a case in which one first micro-pixel controller 131 controls the pixels of a 2×2 array, the first micro-pixel controller 131 may include a pixel circuit 131PR for driving a red inorganic light emitting device 120R, a pixel circuit 131PG for driving a green inorganic light emitting device 120G, and a pixel circuit 131PB for driving a blue inorganic light emitting device 120B, the red inorganic light emitting device 120R, the green inorganic light emitting device 120G, and the blue inorganic light emitting device 120B being included in each of four pixels.

A drive current $I_D$PR output from the red pixel circuit 131PR may be input to the red inorganic light emitting device 120R, a drive current $I_D$PG output from the green pixel circuit 131PG may be input to the green inorganic light emitting device 120G, and a drive current $I_D$PB output from the blue pixel circuit 131PB may be input to the blue inorganic light emitting device 120B.

In addition, the first micro-pixel controller 131 may further include a control circuit 131C to distribute an input signal to the pixel circuit 131P. When a gate signal output from the scan driver 210 or another micro-pixel controller 130 or internally generated and the data signal output from the data driver 220 are input, the control circuit 131C may distribute the input gate signal and data signal to each pixel circuit 131P according to a control logic. To this end, the control circuit 131C may include a multiplexer or demultiplexer, and the control logic may be determined by a timing control signal.

As described above, the first micro-pixel controller 131 may transmit a signal to another adjacent first micro-pixel controller 131. For example, the first micro-pixel controller 131 may transmit the gate signal to the next first micro-pixel controller 131 adjacent in the row direction and transmit the data signal to the next first micro-pixel controller 131 adjacent in the column direction.

As described above, when the gate signal and the data signal are transmitted through the first micro-pixel controller 131, complexity of wiring may be reduced, and the active area of the display panel 100 may be efficiently used.

Figure 17:
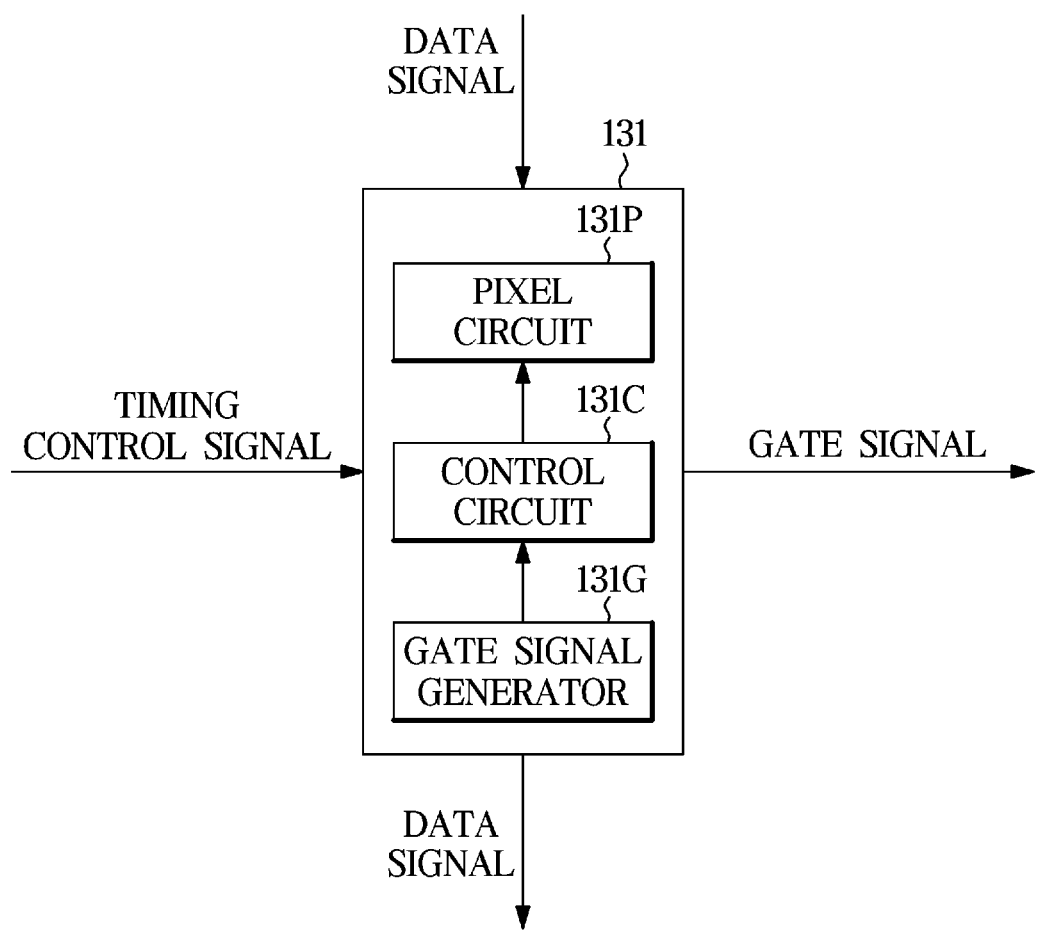
FIG. 17 is a view illustrating a structure of a first micro-pixel controller which generates a gate signal in a display module according to an embodiment.

FIG. 17 is a view illustrating a structure of the first micro-pixel controller which generates the gate signal in the display module according to an embodiment.

Referring to FIG. 17, a gate signal generator 131G may be further included in the first micro-pixel controller 131. A timing control signal may be input to the gate signal generator 131G, and the gate signal generator 131G may generate a gate signal for turning the switching transistor $TR_1$ of the pixel circuit 131P on/off based on the timing control signal. The timing control signal may include a reset signal and a clock signal for generating a gate pulse.

The gate signal generated by the gate signal generator 131G may be distributed to each of the pixel circuits 131P by the control circuit 131C. The control circuit 131C may distribute the gate signal to the appropriate pixel circuits 131P at an appropriate timing based on the timing control signal.

Meanwhile, a gate signal generated in the first micro-pixel controller 131 may be transmitted to the next first micro-pixel controller 131 adjacent in the row direction. Alternatively, the gate signal generator 131G may also be provided in each of the first micro-pixel controllers 131. Alternatively, the plurality of first micro-pixel controllers 131 may be grouped, and one first micro-pixel controller 131 may generate a gate signal in each group and transmit the generated gate signal to the other first micro-pixel controllers 131 included in the same group.

Figure 18:
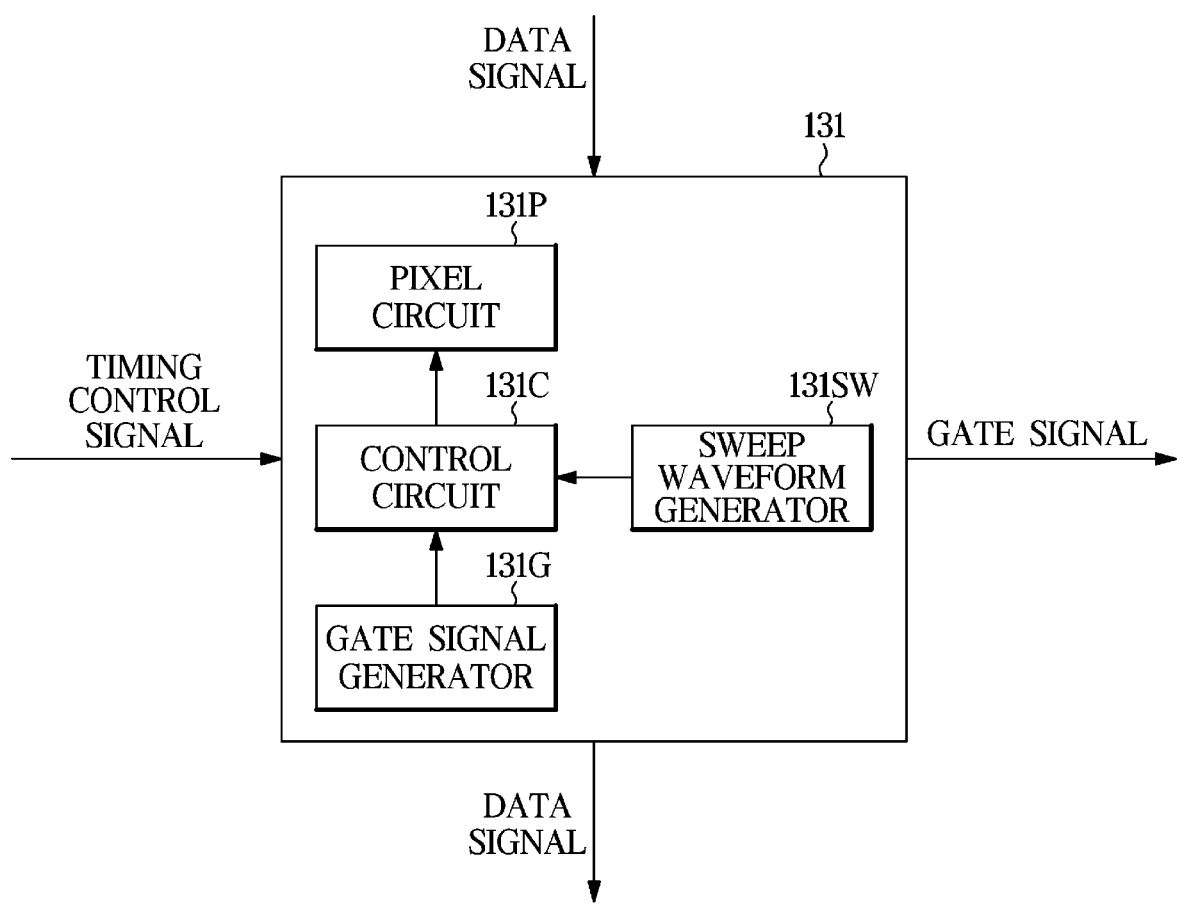
FIG. 18 is a view illustrating a structure of a first micro-pixel controller which generates a sweep waveform in a display module according to an embodiment.

FIG. 18 is a view illustrating a structure of the first micro-pixel controller which generates a sweep waveform in the display module according to an embodiment.

In the present embodiment, a method of controlling brightness of the inorganic light emitting device 120 is not limited. The brightness of the inorganic light emitting device 120 may be controlled by one of various methods such as a pulse amplitude modulation (PAM) method, a pulse width modulation method (PWM), and a hybrid method in which the PAM method and the PWM method are combined.

In an example in which the brightness of the inorganic light emitting device 120 is controlled by the hybrid method, a time at which a drive current is supplied to the inorganic light emitting device 120 may be adjusted by comparing a drive voltage and a sweep voltage of the inorganic light emitting device 120. To this end, circuit components, such as a capacitor and a comparator, for PWM control may be further included in the pixel circuit 131P.

As illustrated in FIG. 18, the first micro-pixel controller 131 may include a sweep waveform generator 131SW, and as an example, the sweep waveform generator 131SW may include an Op-amp-based integration circuit. A circuit structure of the sweep waveform generator 131SW is not limited as long as an output voltage having an inclination is generated.

A sweep waveform generated by the sweep waveform generator 131SW may be input to the pixel circuit 131P. According to a design, the sweep waveform may also be distributed to each of the pixel circuits 131P through the control circuit 131C or may also be directly input to each of the pixel circuits 131P.

The sweep waveform generator 131SW may be provided in each of the first micro-pixel controllers 131 and may also be provided in one first micro-pixel controller 131 in each of rows or columns. In the latter case, the first micro-pixel controller 131, which generates a sweep waveform, may transmit the generated sweep waveform to another first micro-pixel controller 131 which controls another pixel included in the same row or column as the pixel controlled by the first micro-pixel controller 131.

Alternatively, the plurality of first micro-pixel controllers 131 may be grouped, the sweep waveform generator 131SW may be provided in one first micro-pixel controller 131 in each group, and the first micro-pixel controller 131, which generates a sweep waveform, may also transmit the generated sweep waveform to another first micro-pixel controller 131 included in the same group.

As illustrated in FIG. 18, when the sweep waveform generator 131SW is provided in the first micro-pixel controller 131, current-resistance (IR) drop occurring while the sweep waveform is transmitted from an external circuit such as the timing controller 500 or noise due to characteristics of devices may be minimized.

Figure 19:
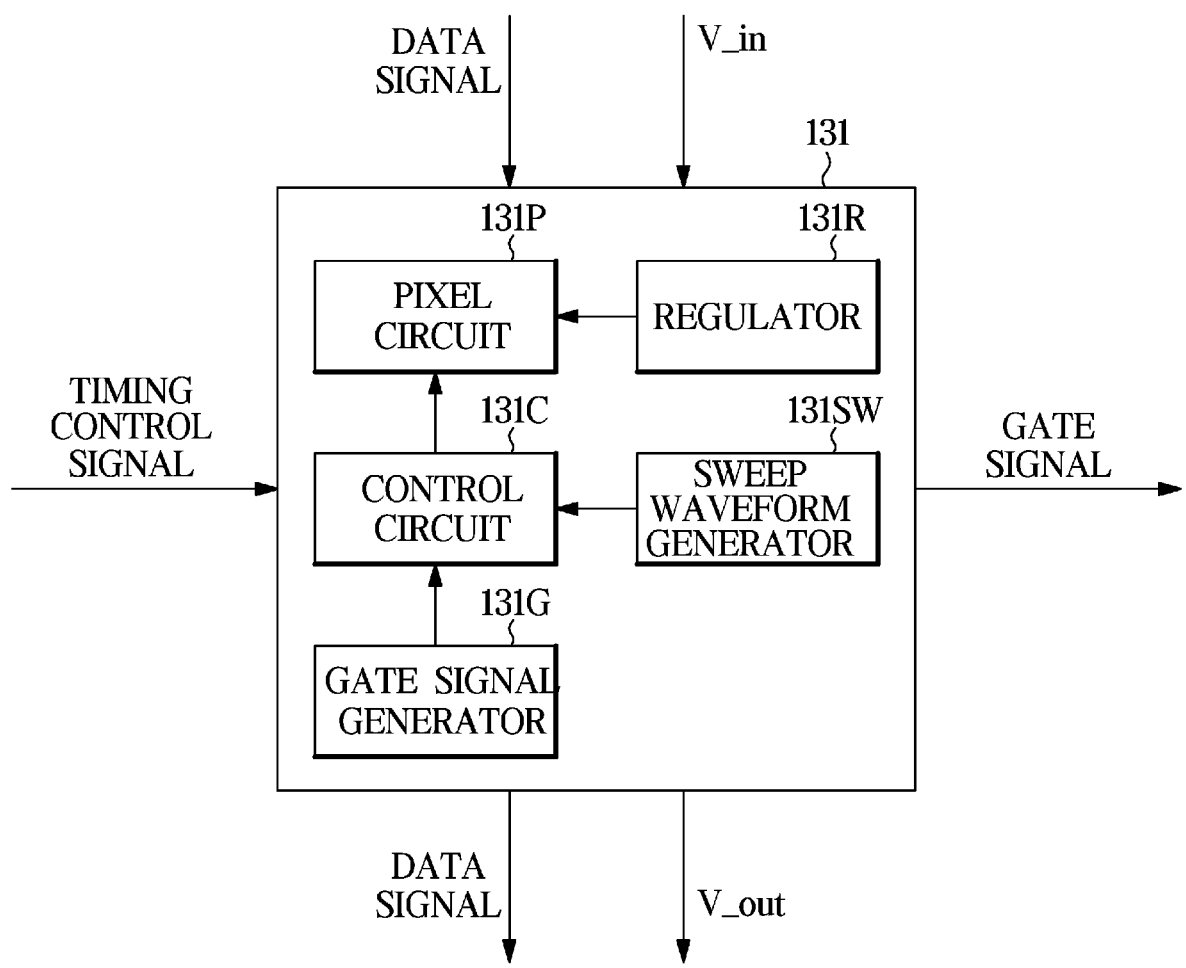
FIG. 19 is a view illustrating a structure of a first micro-pixel controller which performs a voltage adjustment function in a display module according to an embodiment.

FIG. 19 is a view illustrating a structure of the first micro-pixel controller which performs the voltage adjustment function in the display module according to an embodiment.

A voltage required to drive each pixel circuit 131P or inorganic light emitting device 120 may be supplied from an external power circuit outside the display panel 100. Accordingly, since IR drop may occur while the voltage is transmitted from the power circuit to the pixel circuit 131P, in the display module 10 according to an embodiment, the micro-pixel controller 130 may include a regulator 131R as illustrated in FIG. 19 to adjust an input voltage V_in to a desired level. For example, the regulator 131R may be implemented by circuit devices such as a diode, a resistor, and a comparator.

The regulator 131R provided in the first micro-pixel controller 131 may adjust an input power voltage $V_{DD}$_in and/or reference voltage $V_{SS}$_in and output a target power voltage $V_{DD}$_out and/or target reference voltage $V_{SS}$_out.

The regulator 131R may generate an output voltage V_out of a desired level by increasing an input voltage when the input voltage is lower than a target voltage or by decreasing an input voltage when the input voltage V_in is higher than the target voltage.

The output voltage V_out adjusted by the regulator 131R may be input to the pixel circuit 131P or the inorganic light emitting device 120. When the adjusted output voltage V_out is the power voltage $V_{DD}$_out, the adjusted output voltage V_out may be input to the pixel circuit 131P, and when the adjusted output voltage V_out is the reference voltage $V_{SS}$_out, the adjusted output voltage V_out may be input to the cathode of the inorganic light emitting device 120.

Meanwhile, the output voltage V_out adjusted by the regulator 131R may be transmitted to the adjacent first micro-pixel controller 131. For example, the output voltage V_out may be transmitted to the first micro-pixel controller 131 adjacent in the column direction.

The transmission of the output voltage V_out may be performed in one direction. For example, the output voltage may be transmitted in a direction in which the data signal is transmitted from the data driver 220, and in a case in which a wire for transmitting the data signal is provided at un upper side of the active area, the output voltage V_out may be transmitted in a downward direction (−Z direction).

In a case in which the regulator 131R is provided in each of the first micro-pixel controllers 131, the regulator 131R of the first micro-pixel controller 131, which receives the output voltage V_out from another first micro-pixel controller 131, may also perform the voltage adjustment. In this case, even when IR drop occurs due to wires between the first micro-pixel controllers 131 or noise occurs due to characteristics of devices, the power voltage VDD and/or reference voltage Vss which has a predetermined level may be applied to the pixel circuit 131P or the inorganic light emitting device 120. The adjusted output voltage V_out may be transmitted again to the next first micro-pixel controller 131 adjacent in the column direction or Z-axis direction.

In addition, in the first micro-pixel controller 131, at least one of an electrostatic discharge (ESD) circuit for static electricity protection, a temperature sensor for controlling heat generation, a DC-DC converter, and an analog-digital converter may be provided. The analog-digital converter may be used when an input signal is an analog signal and a circuit, which requires the analog signal, is a digital circuit.

For example, a measured value of the temperature sensor may be transmitted to the timing controller 500 or the main controller 300, and the timing controller 500 or the main controller 300 may perform heat generation control such as outputting a control signal to reduce brightness of the inorganic light emitting device 120 based on the measured value of the temperature sensor, and the like.

In addition, the ESD circuit, the temperature sensor, the analog-digital converter, or the DC-DC converter may be provided in each of the first micro-pixel controllers 131 or may also be provided in some of the first micro-pixel controllers 131.

The above description is only examples of functions performable by the first micro-pixel controller 131, and all of the functions do not have to be applied to the first micro-pixel controller 131. Only some of the above-described functions may be applied to the first micro-pixel controller 131, and some of the functions may overlap those of the second micro-pixel controller 132, which will be described below.

Figure 20:
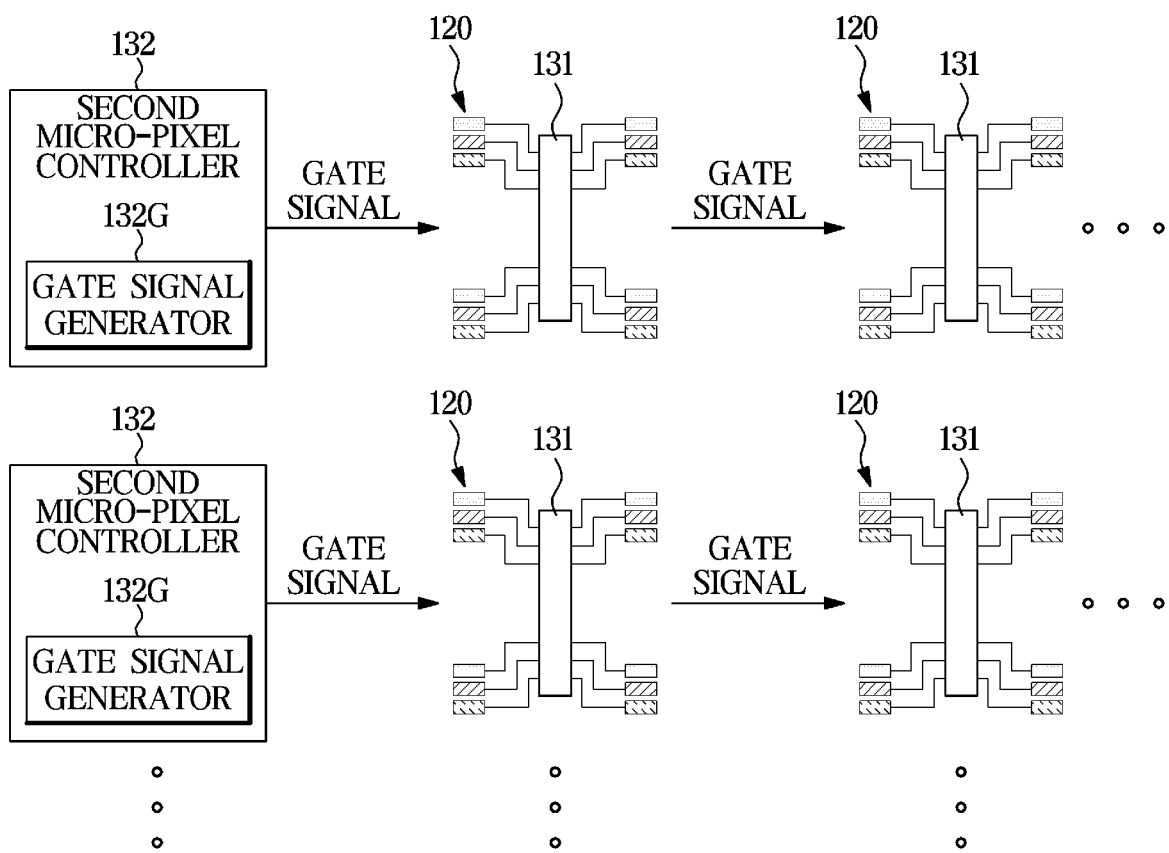
FIG. 20 is a view illustrating a second micro-pixel controller which generates a gate signal in a display module according to an embodiment.
Figure 21:
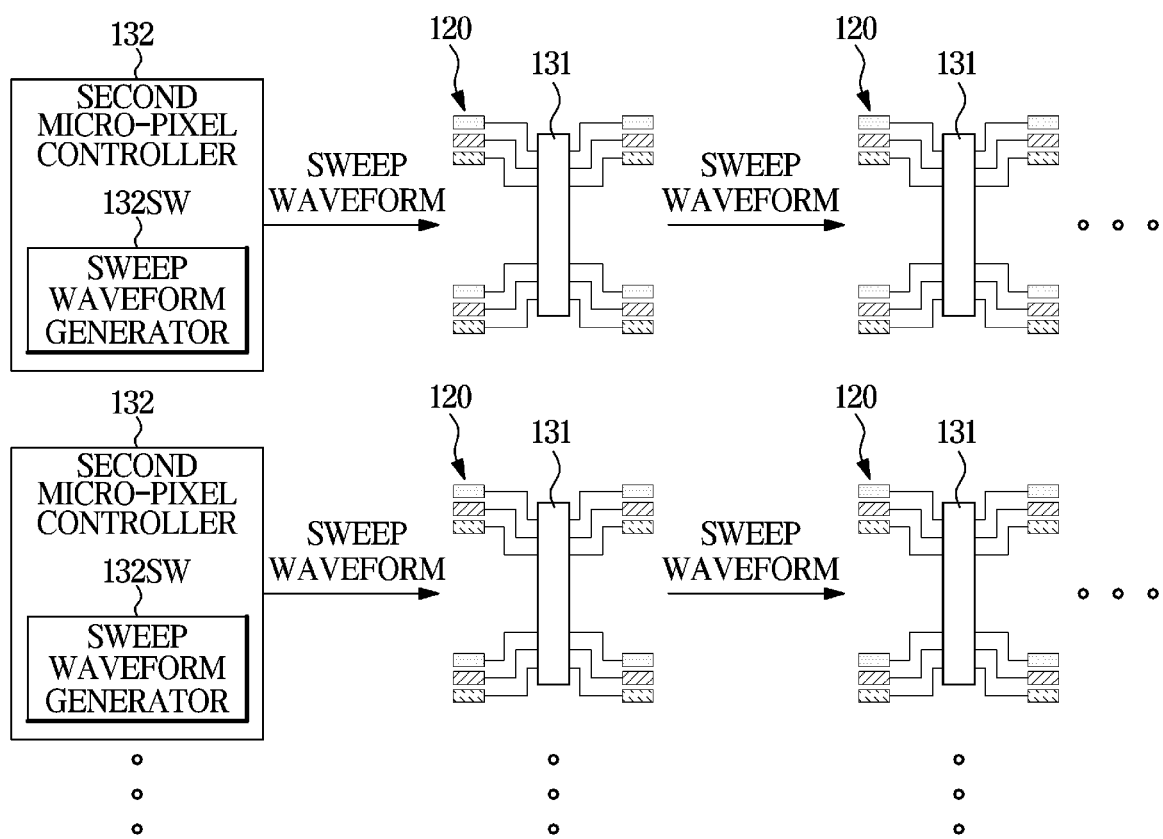
FIG. 21 is a view illustrating a second micro-pixel controller which generates a sweep waveform in a display module according to an embodiment.

FIG. 20 is a view illustrating the second micro-pixel controller which generates a gate signal in the display module according to an embodiment, and FIG. 21 is a view illustrating the second micro-pixel controller which generates a sweep waveform in the display module according to an embodiment.

Referring to FIG. 20, each of the second micro-pixel controllers 132 arranged in the left periphery area EA_L in the column direction may include a gate signal generator 132G. The second micro-pixel controller 132 including the gate signal generator 132G may also be disposed in the right periphery area EA_R. In consideration of efficiency of wiring, the second micro-pixel controller 132 may be disposed according to a position of a wire through which a signal is input from the timing controller 500.

The timing control signal output from the timing controller 500 may be input to the second micro-pixel controller 132, and the gate signal generator 132G of the second micro-pixel controller 132 may generate a gate signal based on the timing control signal.

The generated gate signal may be transmitted to the first micro-pixel controller 131 corresponding to the second micro-pixel controller 132. That is, the gate signal may be transmitted to the first micro-pixel controller 131 which shares the control target pixel with the second micro-pixel controller 132.

The generated gate signal may be input to the first micro-pixel controller 131 most adjacent to the second micro-pixel controller 132 among the plurality of first micro-pixel controllers 131 corresponding to the second micro-pixel controller 132.

In a case in which the second micro-pixel controller 132 performs the gate signal generation function, the gate signal generator 131G may not be included in the first micro-pixel controller 131. The control circuit 131C of the first micro-pixel controller 131 may transmit the input gate signal to the next first micro-pixel controller 131 adjacent in the row direction and distribute the input gate signal to each of the pixel circuits 131P according to a control logic.

Referring to FIG. 21, each of the second micro-pixel controllers 132 arranged in the left periphery area EA_L in the column direction may include a sweep waveform generator 132SW. The second micro-pixel controller 132 including the sweep waveform generator 132SW may also be disposed in the right periphery area EA_R.

As described above, the sweep waveform generator 132SW may receive a power voltage and/or a reference voltage and generate a sweep waveform, and the generated sweep waveform may be transmitted to the first micro-pixel controller 131 corresponding to the second micro-pixel controller 132. That is, the sweep waveform may be transmitted to the first micro-pixel controller 131 which shares the control target pixel with the second micro-pixel controller 132.

The generated sweep waveform may be transmitted to the first micro-pixel controller 131 most adjacent to the second micro-pixel controller 132 among the plurality of first micro-pixel controllers 131 corresponding to the second micro-pixel controller 132.

In a case in which the second micro-pixel controller 132 performs the sweep waveform generation function, the sweep waveform generator 131SW may not be included in the first micro-pixel controller 131. The transmitted sweep waveform may be input to each of the pixel circuits 131P and used for PWM control.

In addition, the first micro-pixel controller 131 to which the sweep waveform is input may transmit the input sweep waveform to the next first micro-pixel controller 131 adjacent in the row direction. As described above, since the plurality of first micro-pixel controllers 131 transmit the sweep waveform, the length and complexity of wiring may be reduced.

Meanwhile, as described above and as illustrated in FIG. 10, in the case in which the second micro-pixel controllers 132 are disposed at both left and right sides of the pixel array area R, all of the second micro-pixel controllers 132 disposed at both sides may generate sweep waveforms and transmit the generated sweep waveforms to the first micro-pixel controllers 131 which control the pixels controlled by the second micro-pixel controllers 132.

All of the plurality of second micro-pixel controllers 132 disposed in the column direction may generate the sweep waveforms, or alternatively, only some of the plurality of second micro-pixel controllers 132 may generate the sweep waveforms.

Meanwhile, in the second micro-pixel controller 132, at least one of an analog-digital converter to convert an analog signal to a digital signal, an ESD circuit for static electricity protection, a regulator for voltage adjustment, and a temperature sensor for heat generation control. The ESD circuit, the analog-digital converter, the regulator, or the temperature sensor may be provided in each of the second micro-pixel controllers 132 or may be provided in some of the second micro-pixel controllers 132.

In addition, the ESD circuit and the temperature sensor may be provided in both sides of the first micro-pixel controller and the second micro-pixel controller and may also be provided in only one type among them.

Figure 22:
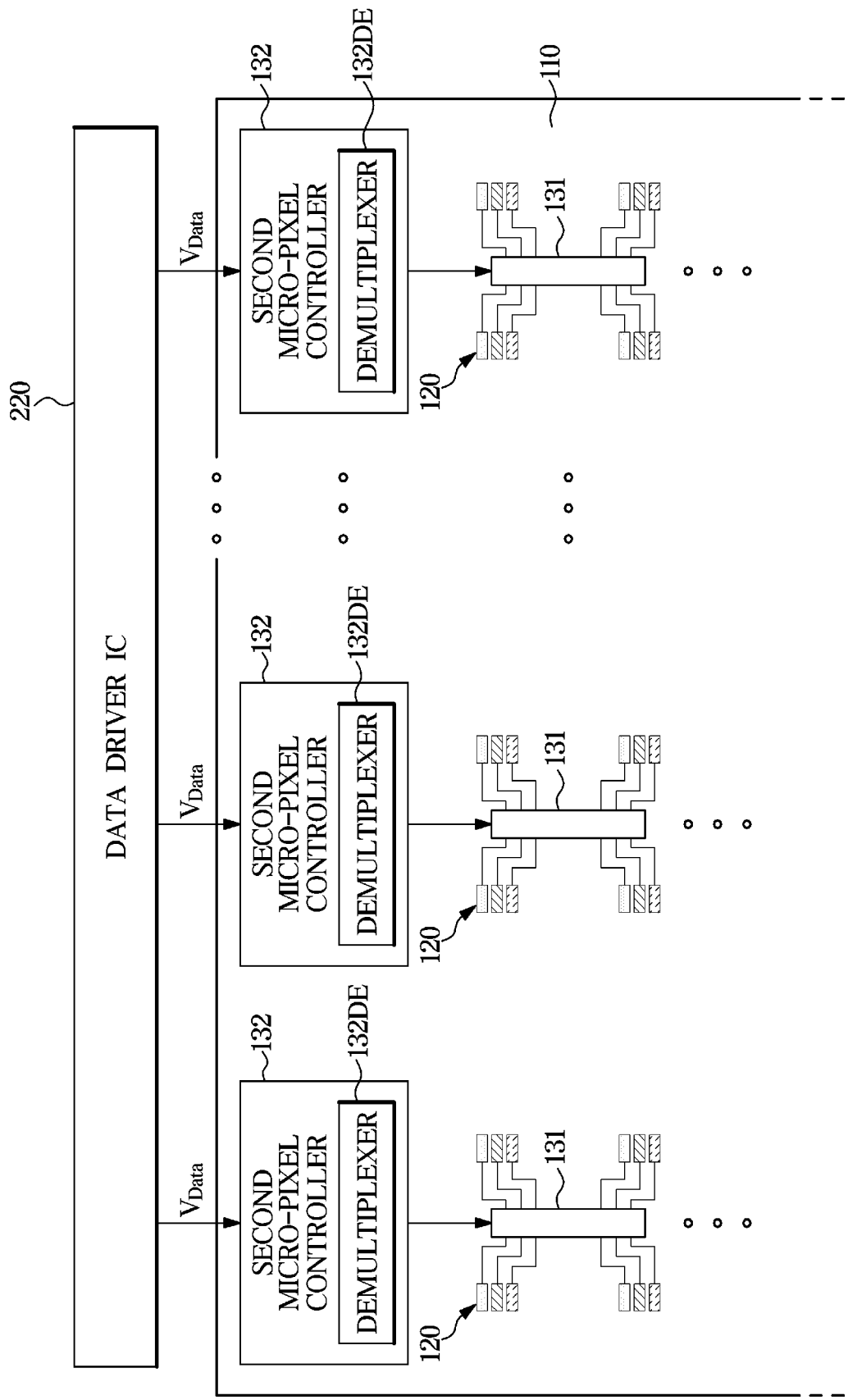
FIG. 22 is a view illustrating a second micro-pixel controller including a demultiplexer in a display module according to an embodiment.
Figure 23:
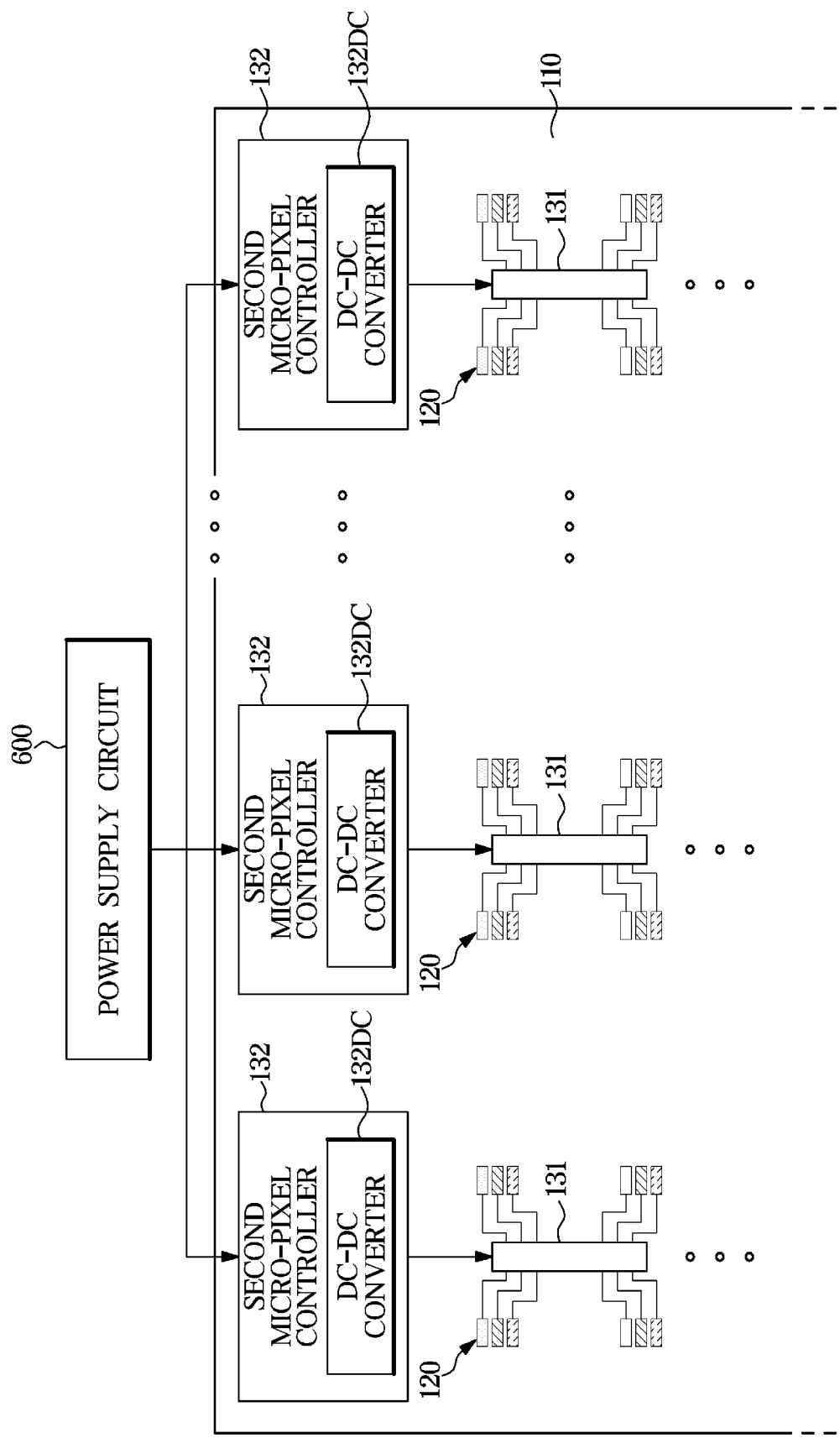
FIG. 23 is a view illustrating a second micro-pixel controller including a direct current (DC)-DC converter in a display module according to an embodiment.

FIG. 22 is a view illustrating the second micro-controller including a demultiplexer in the display module according to an embodiment, and FIG. 23 is a view illustrating the second micro-controller including a DC-DC converter in the display module according to an embodiment.

Referring to FIG. 22, the second micro-pixel controller 132 arranged in the upper periphery area EA_U in the row direction may include a demultiplexer 132DE. The second micro-pixel controller 132 including the demultiplexer 132DE may also be disposed in the lower periphery area EA_B. In consideration of efficiency of wiring, the second micro-pixel controller 132 may be disposed according to a position of a wire through which a signal is input from the data driver IC 220.

The data signal output from the data driver IC 220 may be input to the second micro-pixel controller 132, and the demultiplexer 132DE of the second micro-pixel controller 132 may output the input data signal through one of a plurality of output wires. That is, the demultiplexer 132DE may have a 1:n (n is an integer greater than or equal to two) output, and since the data signal to be input to n columns is transmitted through one wire, a wiring area formed in a side surface of the module substrate 110 may be reduced.

The data signal output from the second micro-pixel controller 132 may be transmitted to the first micro-pixel controller 131 corresponding to the second micro-pixel controller 132. That is, the data signal may be transmitted to the first micro-pixel controller 131 which shares the control target pixel with the second micro-pixel controller 132.

The data signal output from the second micro-pixel controller 132 may be input to the first micro-pixel controller 131 most adjacent to the second micro-pixel controller 132 among the plurality of first micro-pixel controllers 131 corresponding to the second micro-pixel controller 132.

The first micro-pixel controller 131 to which the data signal is input may transmit the data signal to the next first micro-pixel controller 131 adjacent in the column direction and distribute the data signal to each of the pixel circuits 131P according to a control logic.

Referring to FIG. 23, each of the second micro-pixel controllers 132 arranged in the upper periphery area EA_U in the row direction may include a DC-DC converter 132DC. The second micro-pixel controller 132 including the DC-DC converter 132DC may also be disposed in the lower periphery area EA_B. In consideration of efficiency of wiring, the second micro-pixel controller 132 may be disposed according to a position of a wire through which power is input from the power circuit.

A DC voltage output from the power circuit may be input to the second micro-pixel controller 132, and the DC-DC converter 132DC of the second micro-pixel controller 132 may convert the input DC voltage to a power voltage, a reference voltage, or an operating voltage of a desired magnitude.

The voltage output from the second micro-pixel controller 132 may be transmitted to the first micro-pixel controller 131 corresponding to the second micro-pixel controller 132. That is, the voltage may be transmitted to the first micro-pixel controller 131 which shares the control target pixel with the second micro-pixel controller 132.

The voltage output from the second micro-pixel controller 132 may be input to the first micro-pixel controller 131 most adjacent to the second micro-pixel controller 132 among the plurality of first micro-pixel controllers 131 corresponding to the second micro-pixel controller 132.

The first micro-pixel controller 131 to which the voltage is input may transmit the voltage to the next first micro-pixel controller 131 adjacent in the column direction. In addition, in the first micro-pixel controller 131, various devices may be operated by the transmitted operating voltage, and the transmitted power voltage may be input to each of the pixel circuits 131P, and the transmitted reference voltage may be input to the inorganic light emitting device 120.

As described above, the embodiment of the display module 10 is not limited to the functions performed by the first micro-pixel controller 131 and the second micro-pixel controller 132 described above. The above-described functions of each micro-pixel controller are only examples for description purposes.

Figure 24:
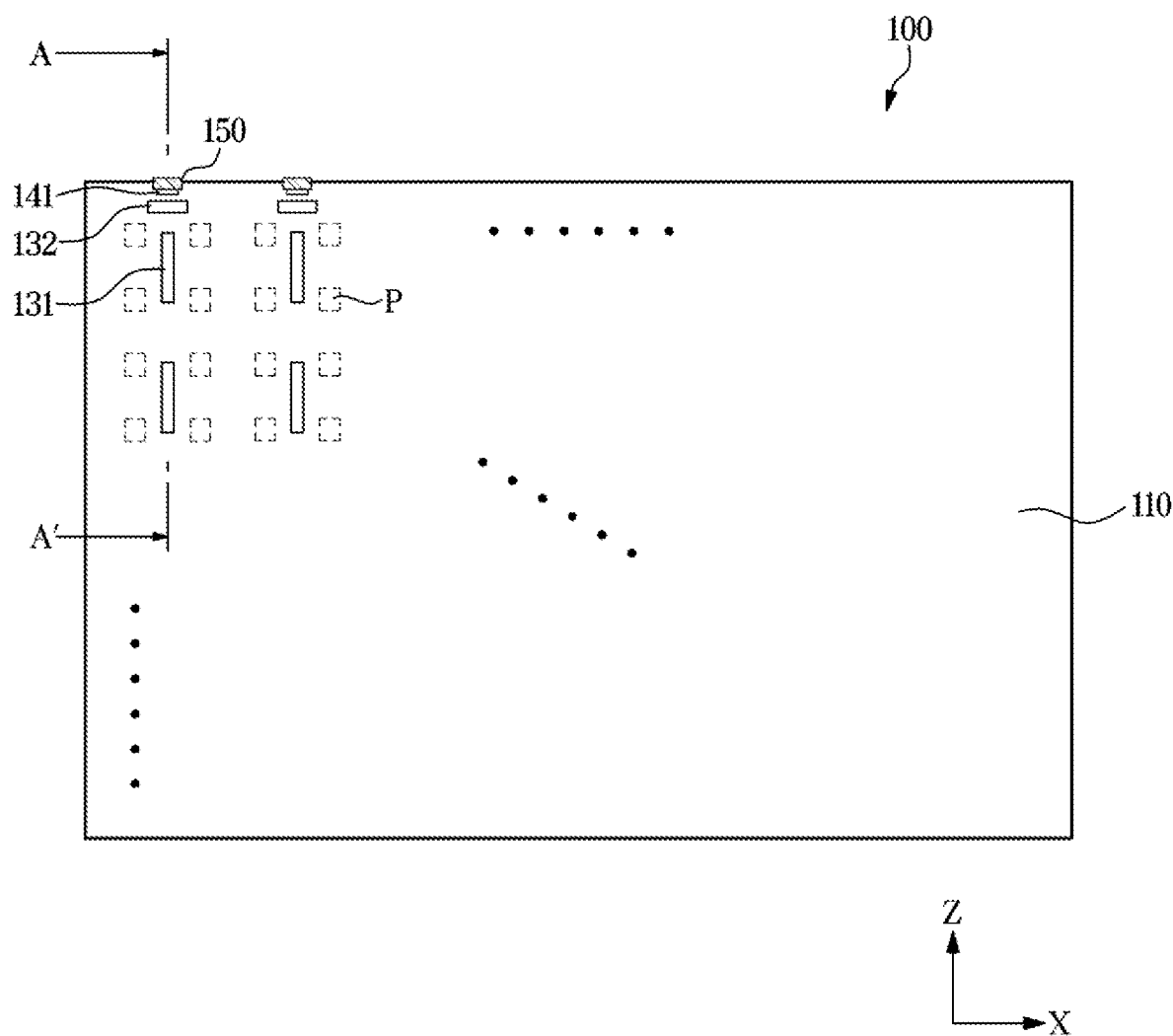
FIG. 24 is a view illustrating an upper surface of a display module according to an embodiment in a case in which a micro-pixel controller is connected to an external circuit through a side surface wire.
Figure 25:
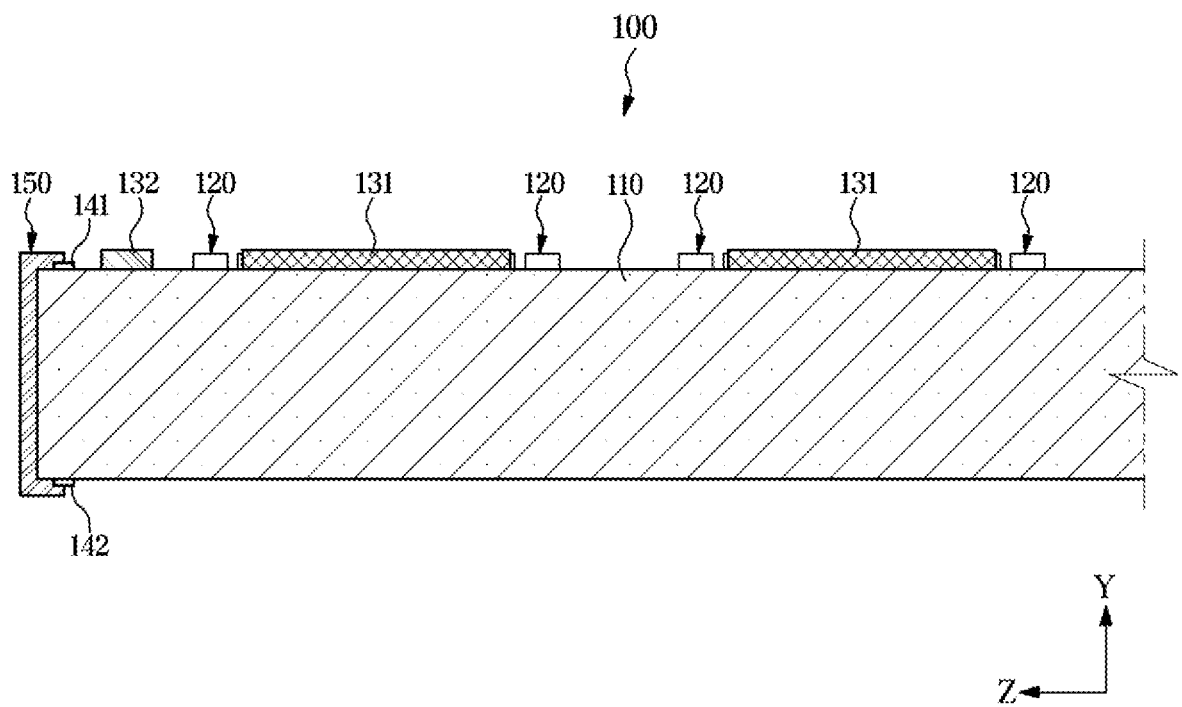
FIG. 25 is a view illustrating a side cross section of a display module according to an embodiment in a case in which a micro-pixel controller is connected to an external circuit through a side surface wire.
Figure 26:
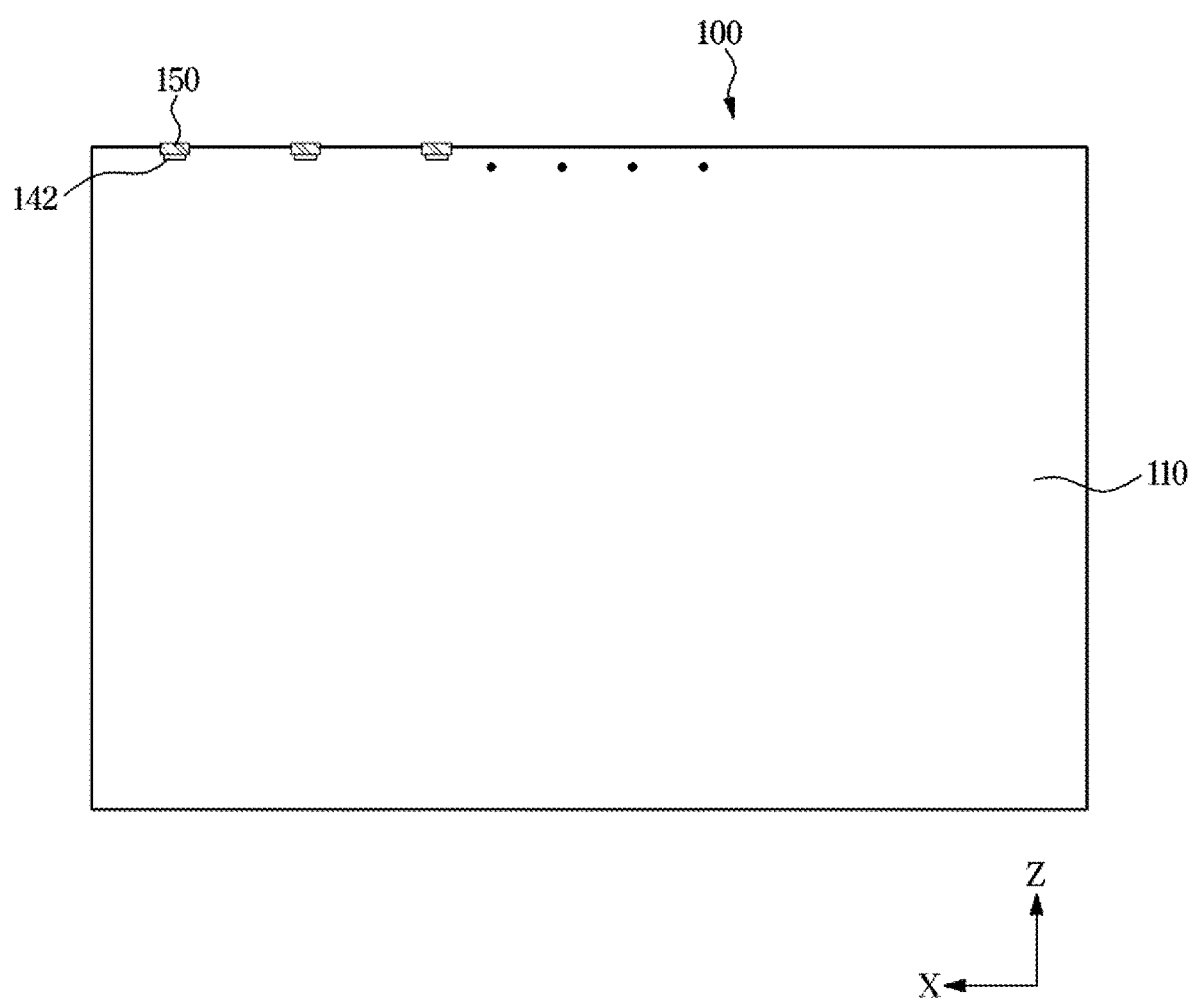
FIG. 26 is a view illustrating a lower surface of a display module according to an embodiment in a case in which a micro-pixel controller is connected to an external circuit through a side surface wire.

FIG. 24 is a view illustrating an upper surface of the display module according to an embodiment in a case in which the micro-pixel controller is connected to the external circuit through a side surface wire, FIG. 25 is a view illustrating a side cross section of the display module according to an embodiment in the case in which the micro-pixel controller is connected to the external circuit through the side surface wire, and FIG. 26 is a view illustrating a lower surface of the display module according to an embodiment in the case in which the micro-pixel controller is connected to the external circuit through the side surface wire. The side cross section illustrated in FIG. 25 is a vertical cross section taken along line A-A' illustrated in FIG. 24.

Referring to FIGS. 24 to 26 together, a side surface wire 150 may be formed on at least one side surface of the module substrate 110 in order to transmit a signal or power provided from the external circuit to the micro-pixel controller 130 or the inorganic light emitting device 120 which is disposed on the upper surface of the module substrate 110. In FIGS. 24 to 26, a case in which the side surface wire 150 is formed on one side surface among four side surfaces is illustrated, but the side surface wire 150 may also be formed on two or more side surfaces.

A plurality of upper connection pads 141 may be disposed in a periphery area of the upper surface of the module substrate 110, and a plurality of lower connection pads 142 may be disposed in a periphery area of a lower surface of the module substrate 110.

The side surface wire 150 may be provided to cover at least a part of the upper connection pad 141, the side surface of the module substrate 110, and at least a part of the lower connection pad 142 so as to electrically connect the upper connection pad 141 and the lower connection pad 142.

An upper wire extending from the first micro-pixel controller 131 or the second micro-pixel controller 132 or an upper wire extending from the pixel P may be electrically connected to the side surface wire 150 through the upper connection pad 141 provided in the periphery area of the upper surface of the module substrate 110.

For example, through the side surface wire 150, a signal may be transmitted from the driver IC 200, a power voltage or reference voltage may be transmitted from the power circuit, or a primary voltage used to generate the power voltage or reference voltage may be transmitted.

The side surface wire 150 may be formed through a method of applying a conductive material onto the side surface of the module substrate 110, and at least one of various methods such as an ink jet method, a stamping method, a screen printing method, a metal deposition method, an adhesive method using tape, and an etching method may be used as the method of applying the conductive material.

As described above, the number of side surface wires 150 may be reduced by using the demultiplexer 132DE.

Figure 27:
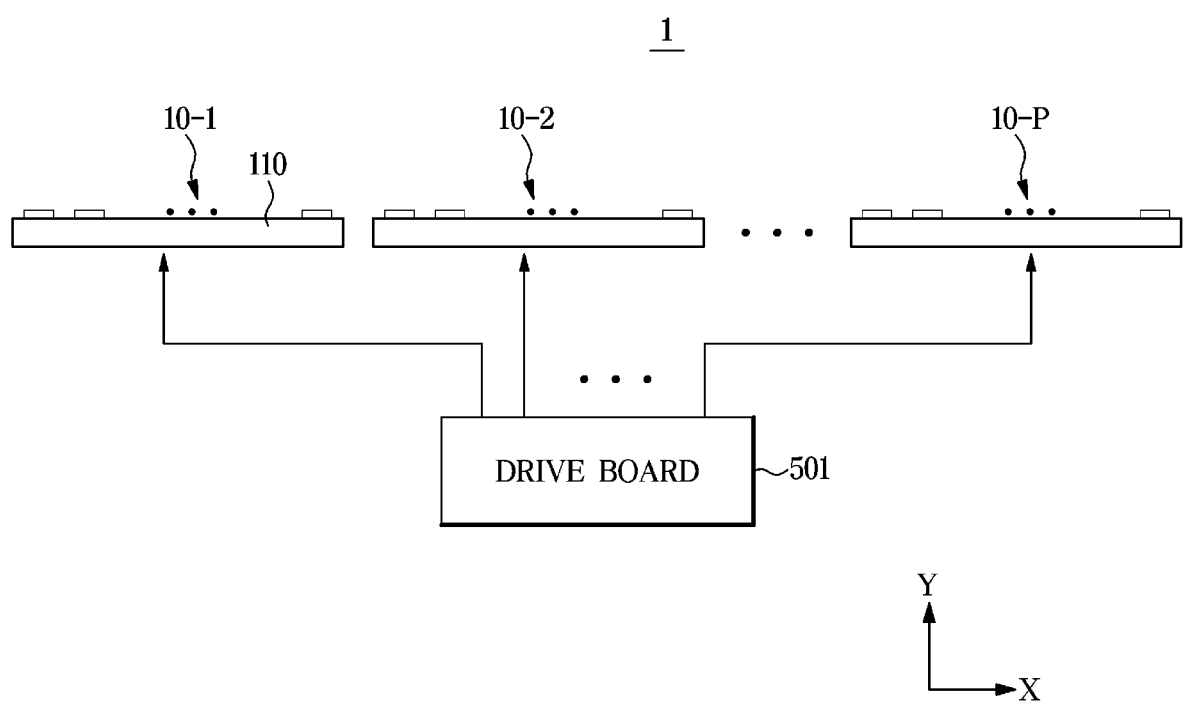
FIGS. 27 and 28 are views illustrating examples of a signal transmitted to a plurality of tiled display modules in a display apparatus according to an embodiment.
Figure 28:
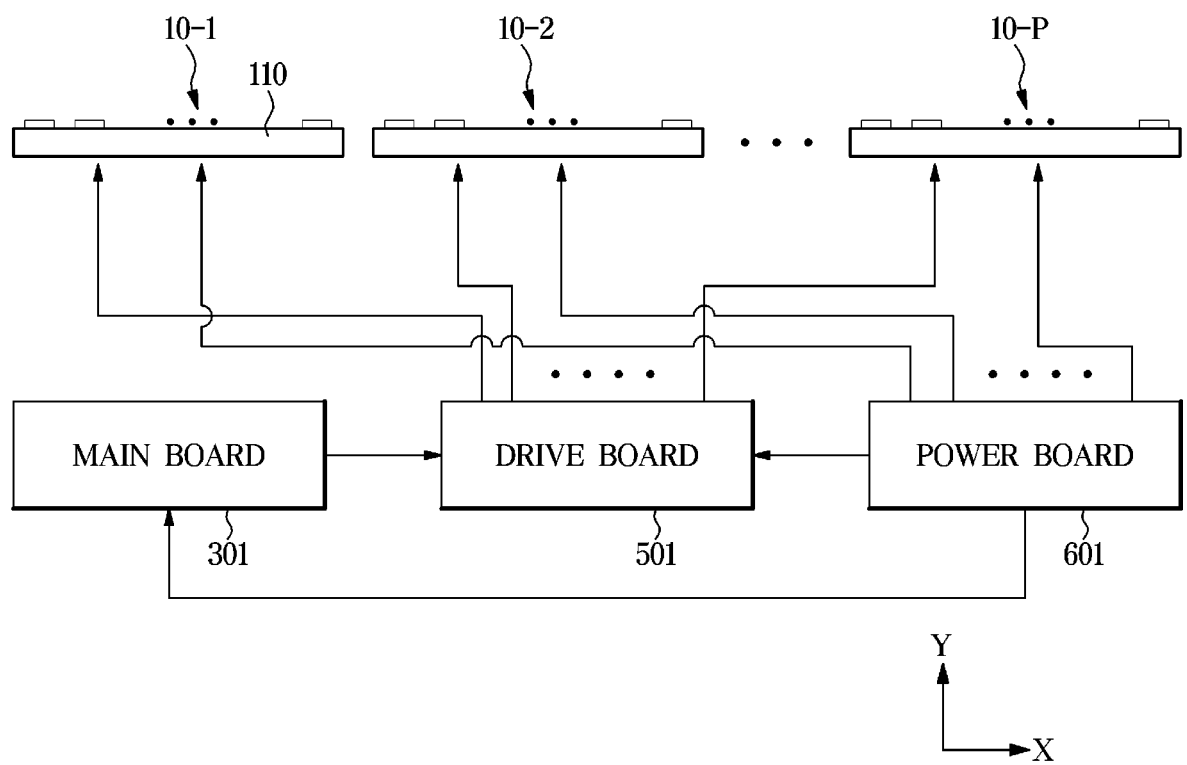

FIGS. 27 and 28 are views illustrating examples of a signal transmitted to a plurality of tiled display modules in the display apparatus according to an embodiment.

As described above, the plurality of display modules 10-1 and 10-2 to 10-*n* may be tiled to implement the display apparatus 1 having a large-area screen. FIG. 27 and FIG. 28 are views illustrating the display apparatus 1 on an XY plane, and only a one-dimensional array of the display modules 10-1 and 10-2 to 10-P is illustrated. However, this is merely an example, and the plurality of display modules 10-1 and 10-2 to 10-*n* may also be two-dimensionally arranged as described above with reference to FIG. 1.

As described above, the display panel 100 may be connected to an FPCB through a film on which the driver IC 200 is mounted. The FPCB may be connected to a drive board 501 to electrically connect the display module 10 to the drive board 501.

The timing controller 500 may be provided on the drive board 501. Accordingly, the drive board 501 may be referred to as a T-con board. The plurality of display modules 10-1 and 10-2 to 10-*n* may receive image data, a timing control signal, and the like from the drive board 501.

Referring to FIG. 28, a main board 301 and a power board 601 may be further included in the display apparatus 1. The above-described main controller 300 may be provided on the main board 301, and the power circuit required for supplying power to the plurality of display modules 10-1 and 10-2 to 10-*n* may be provided on the power board 601.

The power board 601 may be connected to the plurality of display modules 10-1 and 10-2 to 10-*n* through an FPCB and may supply a power voltage $V_{DD}$, a reference voltage Vss, other operating voltages, and the like to the plurality of display modules 10-1 and 10-2 to 10-*n* electrically connected thereto through the FPCB.

In the above-described example, it is described that the plurality of display modules 10-1 and 10-2 to 10-P share the drive board 501, but a separate drive board 501 may also be connected to each of the display modules 10. Alternatively, the plurality of display modules 10-1 and 10-2 to 10-P are grouped, and one drive board 501 may also be connected to each group.

Figure 29:
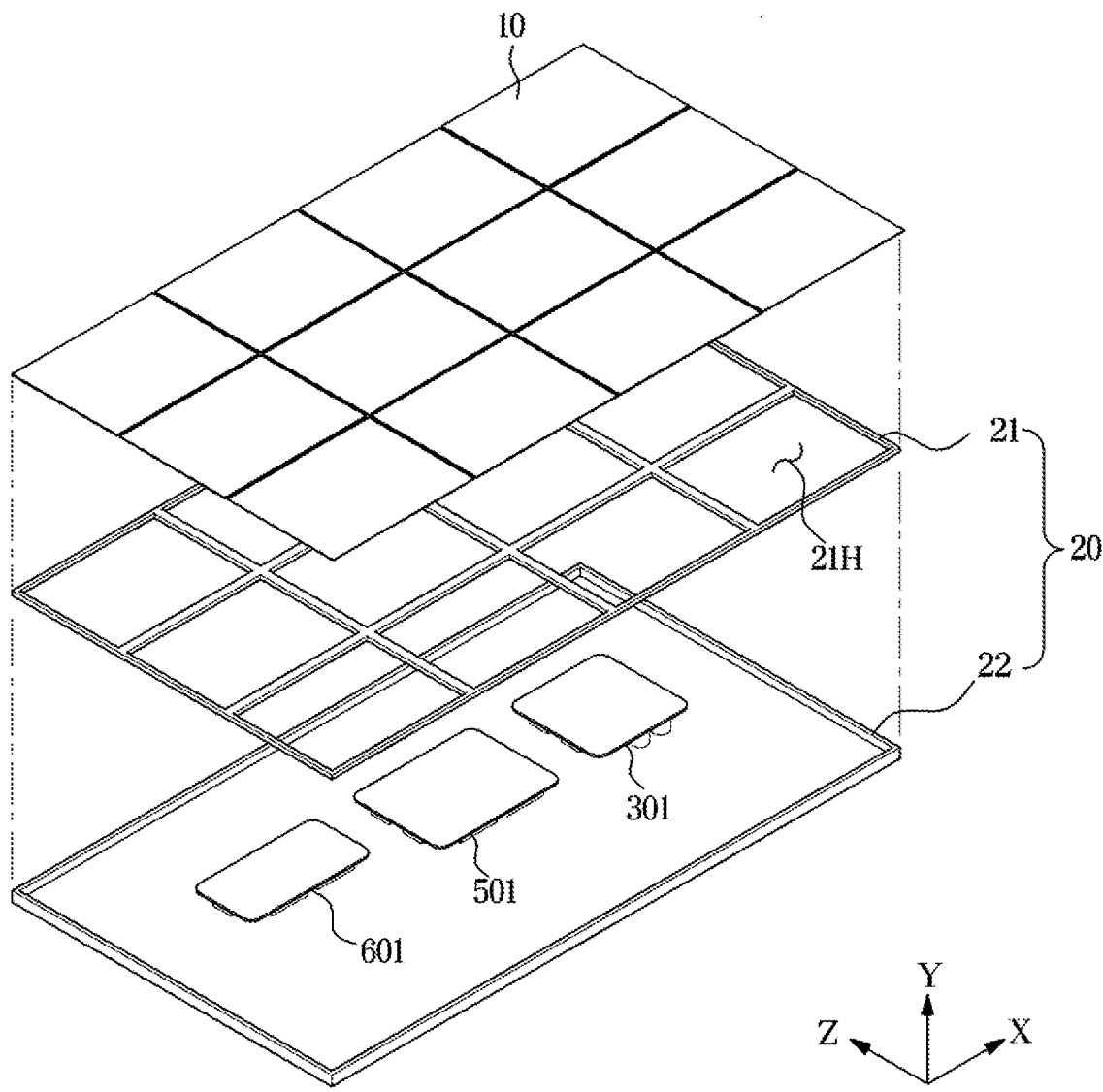
FIG. 29 is a view illustrating one example of a method in which a plurality of display modules are coupled to a housing in a display apparatus according to an embodiment.

FIG. 29 is a view illustrating one example of a method in which the plurality of display modules are coupled to a housing in the display apparatus according to an embodiment.

As described above, the plurality of display modules 10 may be two-dimensionally arranged in a matrix type and fixed to the housing 20. Referring to the example of FIG. 29, the plurality of display modules 10 may be installed on a frame 21 positioned under the plurality of display modules 10, and the frame 21 may have a two-dimensional mesh structure of which some areas corresponding to the plurality of display modules 10 are open.

Specifically, openings 21H, of which the number is the same as the number of the display modules 10, may be formed in the frame 21, and an array of the openings 21H may be the same as an array of the plurality of display modules 10.

In addition, a size of each of the openings 21H may be determined according to the position, size, and number of the micro-pixel controllers 130 disposed on the lower surface of the module substrate 110. For example, the opening 21H may have a size capable of exposing all of the plurality of micro-pixel controllers 130 disposed on the lower surface of the module substrate 110.

A periphery area of the lower surface of each of the plurality of display modules 10 may be provided on the frame 21. The periphery area provided on the frame 21 is an area in which the micro-pixel controller 130 is not disposed.

Meanwhile, the plurality of display modules 10 may be installed on the frame 21 by using a magnetic force of a magnet, being coupled thereto by a mechanical structure, or being adhered thereto by an adhesive. A method of installing the display module 10 on the frame 21 is not limited.

The drive board 501, the main board 301, and the power board 601 may be disposed under the frame 21 and electrically connected to the plurality of display modules 10 through the openings 21H formed in the frame 21.

A lower cover 22 is coupled to a lower portion of the frame 21, and the lower cover 22 may form an exterior of the lower surface of the display apparatus 1.

In the above-described embodiment, although an example in which the display modules 10 are two-dimensionally arranged is described, the display modules 10 may also be one-dimensionally arranged, and in this case, a structure of the frame 21 may be changed to a one-dimensional mesh structure.

Figure 30:
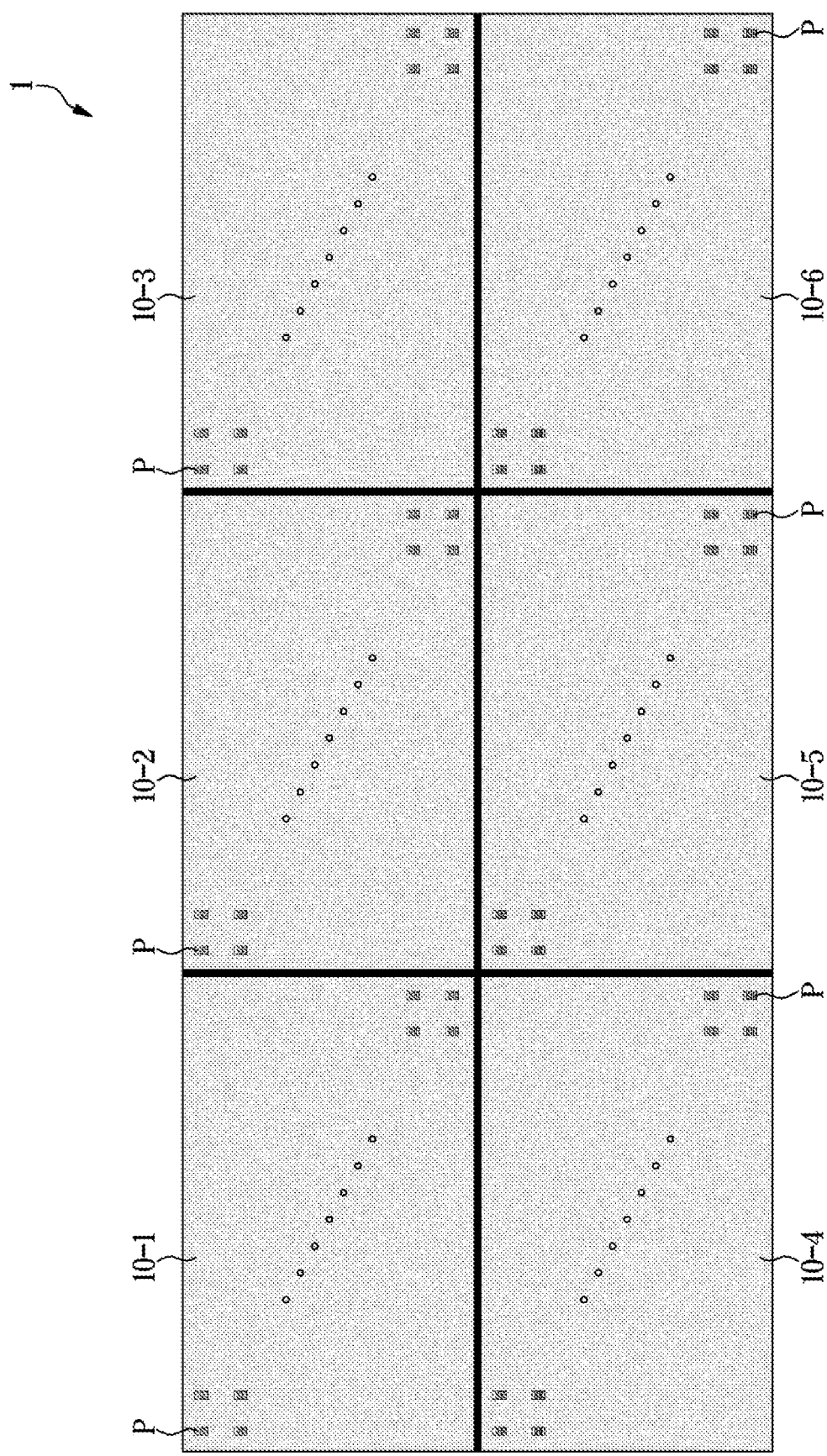
FIG. 30 is a view illustrating an example of a black matrix (BM) process performed on a plurality of display modules in a display apparatus according to an embodiment.

FIG. 30 is a view illustrating an example of a black matrix (BM) process performed on the plurality of display modules in the display apparatus according to an embodiment.

Referring to FIG. 30, the BM process may be performed on each of display modules 10-1 to 10-6 to block unnecessary light except for light required for implementing an image, prevent scattered reflection of light occurring at gaps between the pixels, and improve contrast.

For example, a BM layer may be formed on the upper surface of the module substrate 110 by applying one of various BM processing methods, such as printing black ink on the upper surface of the module substrate 110, performing patterning using a black photosensitive material, or using a black ACF when the inorganic light emitting device 120 is mounted on the module substrate 110.

In addition, the BM process may be performed on an upper surface of the micro-pixel controller 130 to form a BM layer.

In addition, the BM process may be performed on spaces between the plurality of display modules 10 to prevent scattered reflection of light occurring in gaps between the modules.

Hereinafter, a method of manufacturing a display module according to an embodiment will be described. According to the method of manufacturing a display module according to an embodiment, the above-described display module 10 may be manufactured. Accordingly, the contents described above with reference to FIGS. 1 to 30 will be applied to the method of manufacturing a display module according to an embodiment even when there is no additional description. Conversely, the method of manufacturing a display module according to an embodiment may be applied to the display module 10 or the display apparatus 1 including the display module 10.

Figure 31:
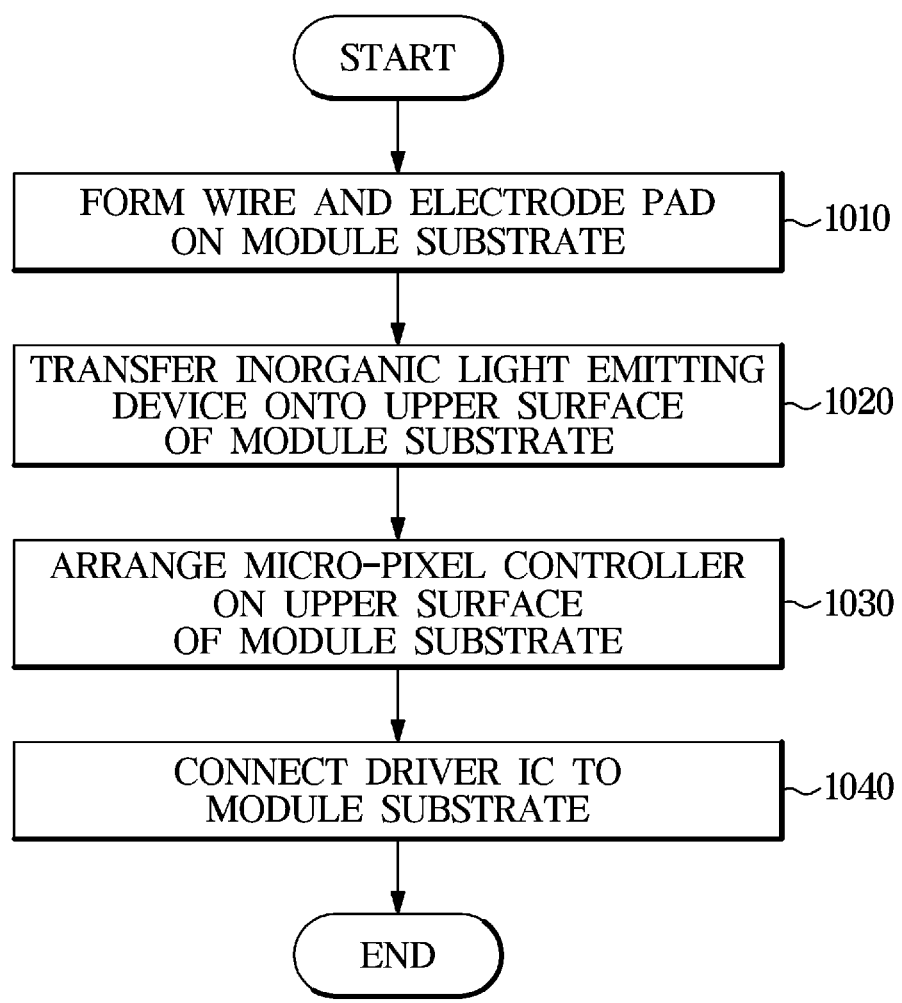
FIG. 31 is a flowchart illustrating a method of manufacturing a display module according to an embodiment.

FIG. 31 is a flowchart illustrating the method of manufacturing a display module according to an embodiment.

Referring to FIG. 31, a wire and an electrode pad are formed on a module substrate (1010).

For example, the wire and the electrode pad may be formed by forming a layer of a metal material such as copper on the upper surface of the module substrate 110, performing a photolithography process including a process of applying, exposing, and developing a photosensitive material, and performing an etching process of electively removing an unnecessary portion.

The wire and the electrode pad formed on the upper surface of the module substrate 110 may be used for electrical connection of the inorganic light emitting device 120 and the micro-pixel controller 130.

In addition, a side surface wire 150 or a VIA hole wire may be formed for connection with an external circuit.

For example, an anode pad and a cathode pad for being respectively connected to an anode and a cathode of the inorganic light emitting device 120 may be formed, and an IC connection pad for being electrically connected to a connection pin provided on a lower surface of the micro-pixel controller 130 may be formed. The anode pad and the IC connection pad or the cathode pad and the IC connection pad may be electrically connected by an upper wire.

The module substrate 110 may be implemented as one of substrates formed of various materials such as a silicon substrate, a glass substrate, a plastic substrate, a PCB, an FPCB, and a cavity substrate. According to an embodiment, circuit devices such as thin film transistors for switching and driving the plurality of inorganic light emitting devices 120 are provided in the separate micro-pixel controller 130 instead of the module substrate 110. Therefore, the circuit devices such as thin film transistors do not need to be formed on the module substrate 110 in addition to the electrode pad or the wire.

Accordingly, when a kind of the module substrate 110 is selected, since other restrictions, such as performance of the thin film transistor, do not need to be considered, the module substrate 110 may be implemented as the glass substrate having high durability against heating of the inorganic light emitting device 120.

In addition, since the circuit devices, such as the thin film transistor, are not provided on the module substrate 110, the circuit devices may be prevented from being broken in a process of cutting the module substrate 110. Also, a difficulty of manufacturing process of the display module 10 such as forming the wire or replacing the inorganic light emitting device 120 may be lowered.

The inorganic light emitting device is transferred onto the upper surface of the module substrate on which the wire and the electrode pad are formed (1020).

As described above, the inorganic light emitting device 120 may be a micro-LED. The micro-LED on a wafer or temporary substrate may be picked up by a transfer mechanism, transmitted to the module substrate 110, and transferred onto the module substrate 110. As an example, the inorganic light emitting device 120 may be transferred onto the module substrate 110 so that the anode and the cathode face the upper surface of the module substrate 110. Any known technique such as a method using a laser, a method using a stamp, and a method using a roller may be used as a transfer method.

When the inorganic light emitting device 120 is transferred onto the module substrate 110, the above-described pixel spacing PP may be maintained.

In addition, according to a method of connecting the inorganic light emitting device 120 and the electrode pad, a soldering material or conductive adhesive may be disposed on or applied to the anode pad and the cathode pad formed on the upper surface of the module substrate 110.

The micro-pixel controller is disposed on the upper surface of the module substrate on which the wire and the electrode pad are formed (1030).

The micro-pixel controller 130 may include at least one type of micro-pixel controller of the first micro-pixel controller 131 and the second micro-pixel controller 132, and the arrangement of the micro-pixel controller 130 may be changed according to the type.

For example, as described with reference to FIGS. 5 and 6, the first micro-pixel controller 131 which performs the pixel drive function may be disposed in the space between the plurality of pixels P controlled by the first micro-pixel controller 131 itself. In this case, since the length of the short side of the first micro-pixel controller 131 is formed to be smaller than the distance D between the boundary lines of the pixels P adjacent to each other, the first micro-pixel controller 131 may be disposed in the space between the plurality of pixels P without affecting the pixel spacing PP.

The first micro-pixel controller 131 may include the above-described pixel circuit 131P for performing the pixel drive function. The pixel circuit 131P including the thin film transistor may be formed on an IC substrate, and the IC substrate may be implemented as one of substrates formed of various materials such as a silicon substrate, a glass substrate, a plastic substrate, a PCB, an FPCB, and a cavity substrate. Since a heat source such as an inorganic light emitting device is not present on the first micro-pixel controller 131, a kind of the substrate may be selected without limitation according to heat resistance of the material. This also applies to the second micro-pixel controller 132.

The thin film transistor formed on the IC substrate may also be a low temperature polycrystalline silicon (LTPS) thin film transistor or oxide thin film transistor. In addition, the thin film transistor may also be an a-Si thin film transistor or single crystal thin film transistor.

For example, in a case in which the thin film transistor included in the pixel circuit 131P is the LTPS thin film transistor, there may be a restriction according to electron mobility when the IC substrate is selected. When the IC substrate is implemented as the silicon substrate, since a silicon substrate does not have a restriction on electron mobility when compared to a glass substrate, performance of the LTPS thin film transistor may be improved. In the present embodiment, since the inorganic light emitting device 120, which is a heat source, is transferred onto the module substrate 110, the IC substrate may be implemented as the silicon substrate without a restriction according to heat resistance.

Meanwhile, before the micro-pixel controller 130 is transferred onto the module substrate 110, circuit testing may be performed on each of the micro-pixel controllers 130, and only the micro-pixel controller 130 determined as being good quality (or passing the testing) through the circuit testing may be mounted on the display module 10. Accordingly, when compared to a case in which the thin film transistor circuit is directly mounted on the module substrate, circuit testing and replacement of a defective product are easier.

The second micro-pixel controller 132 may be disposed in the periphery area EA on the upper surface of the module substrate 110. For example, the second micro-pixel controller 132 which performs the gate signal generation function may be disposed in the left periphery area EA_L or the right periphery area EA_R, and the second micro-pixel controller 132 which performs the demultiplexing function may be disposed in the upper periphery area EA_U or the lower periphery area EA_U.

Since various functions such as the pixel drive function, the scan signal generation function, the DC-DC conversion function, the analog-digital conversion function, the sweep waveform generation function, the voltage regulating function, the multiplexing function, the demultiplexing function, the ESD protection function, and the heat radiation detection function are performed by the micro-pixel controller 130 disposed on the module substrate 110, the wiring, the structure, and the manufacturing process of the display module may be simplified, and the volume may be reduced, and the freedom degree of substrate selection may become high.

The driver IC is connected to the module substrate (1040).

As described above, the driver IC 200 may be connected to the module substrate 110 using one of various bonding methods such as a chip on film (COF) or film on glass (FOG) bonding method, a chip on glass (COG) bonding method, and a tape automated bonding (TAB) method.

In addition, the FPCB is connected to the module substrate 110 so that the module substrate 110 may be connected to the drive board 501, the main board 301, and the power board 601, and the plurality of display modules 10 may be tiled to manufacture the display apparatus 1 having a large-area screen.

The above-described detailed description illustrates the disclosure. In addition, the above description describes example embodiments of the disclosure, and the disclosure may be used through various other combinations, modifications, and environments. That is, the disclosure may be changed or modified within a range of the concept of the disclosure, a range equivalent to the disclosed contents, and/or a range of a technology or knowledge of the art. The above-described embodiments describe examples to realize the technical spirit of the disclosure, and various modifications required in specific application fields and uses of the disclosure may also be implemented. Therefore, the above-described detailed description of the disclosure is not intended to limit the disclosure in the disclosed embodiments. In addition, it should be interpreted that the range of the appended claims also includes other embodiments.

What is claimed is:

1. A display module comprising:
a substrate;
a plurality of pixels provided on a surface of the substrate, each pixel of the plurality of pixels including a plurality of inorganic light emitting diodes (LEDs); and
a plurality of first micro-pixel controllers provided in spaces between the plurality of pixels and configured to control the plurality of inorganic LEDs of each pixel of the plurality of pixels;
a plurality of second micro-pixel controllers provided in a periphery area of the surface of the substrate, the periphery area being outside a pixel array area that is defined by outermost pixels among the plurality of pixels;
wherein each first micro-pixel controller of the plurality of first micro-pixel controllers is configured to control the plurality of inorganic LEDs of at least two pixels among the plurality of pixels,
wherein at least one function performed by the plurality of first micro-pixel controllers is different from at least one function performed by the plurality of second micro-pixel controllers, the at least one function performed by the plurality of second micro-pixel controllers including a gate signal generation function and a sweep waveform generation function,
wherein a gate signal and a sweep waveform generated by a second micro-pixel controller are input to a first micro-pixel controller most adjacent to the second micro-pixel controller in a first direction, and
wherein the most adjacent first micro-pixel controller is configured to distribute the input gate signal and the input sweep waveform to each of the at least two pixels controlled by the most adjacent first micro-pixel controller according to a control logic, and transmit the input gate signal and the input sweep waveform to a next first micro-pixel controller adjacent in the first direction.

2. The display module of claim 1, wherein the periphery area is included in an active area or a bezel area.

3. The display module of claim 2, wherein the plurality of second micro-pixel controllers are provided in at least one of a left periphery area or a right periphery area along a column direction.

4. The display module of claim 2, wherein the plurality of second micro-pixel controllers are provided in at least one of an upper periphery area or a lower periphery area along a row direction.

5. The display module of claim 2, wherein a first portion of the plurality of second micro-pixel controllers is provided in at least one of a left periphery area or a right periphery area along a column direction, and
wherein a second portion of the plurality of second micro-pixel controllers is provided in at least one of an upper periphery area or a lower periphery area along a row direction.

6. The display module of claim 5, wherein at least one function performed by a second micro-pixel controller among the first portion of the plurality of second micro-pixel controllers is different from at least one function performed by a second micro-pixel controller among the second portion of the plurality of second micro-pixel controllers.

7. The display module of claim 1, wherein each first micro-pixel controller of the plurality of first micro-pixel controllers includes at least two pixel circuits configured to drive the at least two pixels.

8. The display module of claim 1, wherein the at least one function performed by the plurality of first micro-pixel controllers and the at least one function performed by the plurality of second micro-pixel controllers further include at least one of a pixel drive function, a voltage conversion function, an analog-digital conversion function, a voltage adjustment function, a multiplexing function, a demultiplexing function, a static electricity protection function, or a heat radiation detection function.

9. A display apparatus comprising:
a plurality of display modules; and
a frame configured to support the plurality of display modules,
wherein each display module of the plurality of display modules comprises:
a substrate;

a plurality of pixels provided on a surface of the substrate, each pixel of the plurality of pixels including a plurality of inorganic light emitting diodes (LEDs);

a plurality of first micro-pixel controllers provided in spaces between the plurality of pixels and configured to control the plurality of inorganic LEDs of each pixel of the plurality of pixels; and a plurality of second micro-pixel controllers provided in a periphery area of the surface of the substrate, the periphery area being outside a pixel array area that is defined by outermost pixels among the plurality of pixels, wherein each first micro-pixel controller of the plurality of first micro-pixel controllers is configured to control the plurality of inorganic LEDs of at least two pixels among the plurality of pixels, wherein at least one function performed by the plurality of first micro-pixel controllers is different from at least one function performed by the plurality of second micro-pixel controllers, the at least one function performed by the plurality of second micro-pixel controllers including a gate signal generation function and a sweep waveform generation function, wherein a gate signal and a sweep waveform generated by a second micro-pixel controller are input to a first micro-pixel controller most adjacent to the second micro-pixel controller in a first direction, and wherein the most adjacent first micro-pixel controller is configured to distribute the input gate signal and the input sweep waveform to each of the at least two pixels controlled by the most adjacent first micro-pixel controller according to a control logic, and transmit the input gate signal and the input sweep waveform to a next first micro-pixel controller adjacent in the first direction.

10. The display apparatus of claim 9, wherein the plurality of second micro-pixel controllers are arranged in at least one of a left periphery area or a right periphery area along a column direction.

11. The display apparatus of claim 9, wherein the plurality of second micro-pixel controllers are arranged in at least one of an upper periphery area or a lower periphery area along a row direction.

12. The display apparatus of claim 9, wherein a first portion of the plurality of second micro-pixel controllers is provided in at least one of a left periphery area or a right periphery area along a column direction, and wherein a second portion of the plurality of second micro-pixel controllers provided in at least one of an upper periphery area or a lower periphery area along a row direction.

13. The display apparatus of claim 12, wherein at least one function performed by a second micro-pixel controller among the first portion of the plurality of second micro-pixel controllers is different from at least one function performed by a second micro-pixel controller among the second portion of the plurality of second micro-pixel controllers.

14. The display apparatus of claim 9, wherein the at least one function performed by the plurality of first micro-pixel controllers and the at least one function performed by the plurality of second micro-pixel controllers further include at least one of a pixel drive function, a voltage conversion function, an analog-digital conversion function, a voltage adjustment function, a multiplexing function, a demultiplexing function, a static electricity protection function or a heat radiation detection function.

15. A display apparatus comprising:

a plurality of display modules; and a frame configured to support the plurality of display modules, wherein each display module of the plurality of display modules comprises:

a substrate;

a plurality of pixels provided on a surface of the substrate, each pixel of the plurality of pixels including a plurality of inorganic light emitting diodes (LEDs);

a plurality of first micro-pixel controllers provided in spaces between the plurality of pixels and configured to control the plurality of inorganic LEDs of each pixel of the plurality of pixels; and a plurality of second micro-pixel controllers provided in a periphery area on the surface of the substrate, the periphery area being outside a pixel array area that is defined by outermost pixels among the plurality of pixels, a first portion of the plurality of second micro-pixel controllers being provided in at least one of a left periphery area or a right periphery area and a second portion of the plurality of second micro-pixel controllers being provided in at least one of an upper periphery area or a lower periphery area, wherein at least one function performed by the plurality of first micro-pixel controllers is different from at least one function performed by the plurality of second micro-pixel controllers, the at least one function performed by the plurality of second micro-pixel controllers including a gate signal generation function and a sweep waveform generation function, wherein a signal output from a second micro-pixel controller among the first portion of the plurality of second micro-pixel controllers is transmitted in a row direction through the plurality of first micro-pixel controllers, wherein a signal output from a second micro-pixel controller among the second portion of the plurality of second micro-pixel controllers is transmitted in a column direction through the plurality of first micro-pixel controllers, wherein a gate signal and a sweep waveform generated by a second micro-pixel controllers among the first portion of the plurality of second micro-pixel controllers are input to a first micro-pixel controller most adjacent to the second micro-pixel controller in the row direction, and wherein the most adjacent first micro-pixel controller is configured to distribute the input gate signal and the input sweep waveform to each of the at least two pixels controlled by the most adjacent first micro-pixel controller according to a control logic, and transmit the input gate signal and the input sweep waveform to a next first micro-pixel controller adjacent in the row direction.

16. The display apparatus of claim 15, wherein the periphery area is included in an active area or a bezel area.

* * * * *